(12) United States Patent
Juszkiewicz et al.

(10) Patent No.: US 11,863,942 B1
(45) Date of Patent: ***Jan. 2, 2024

(54) MICROPHONE ARRAY WITH AUTOMATED ADAPTIVE BEAM TRACKING

(71) Applicant: Biamp Systems, LLC, Beaverton, OR (US)

(72) Inventors: Richard S. Juszkiewicz, Portland, OR (US); Nicholas William Metzar, Beaverton, OR (US); Iain Alexander McCowan, Ashmore (AU); Matthew V. Kotvis, Portland, OR (US); Jason Damori, Lake Oswego, OR (US); Scott Wieser, Portland, OR (US)

(73) Assignee: Biamp Systems, LLC, Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/149,083

(22) Filed: Dec. 31, 2022

Related U.S. Application Data

(63) Continuation of application No. 17/396,802, filed on Aug. 9, 2021, now Pat. No. 11,606,656, which is a continuation of application No. 16/590,168, filed on Oct. 1, 2019, now Pat. No. 11,089,418, which is a continuation of application No. 16/017,598, filed on Jun. 25, 2018, now Pat. No. 10,433,086.

(51) Int. Cl.
*H04R 3/00* (2006.01)
*H04R 29/00* (2006.01)
*H03G 3/30* (2006.01)
*H04R 1/40* (2006.01)

(52) U.S. Cl.
CPC ......... *H04R 29/002* (2013.01); *H03G 3/3005* (2013.01); *H04R 1/403* (2013.01); *H04R 1/406* (2013.01); *H04R 2430/01* (2013.01)

(58) Field of Classification Search
CPC ...... H04R 29/002; H04R 1/403; H04R 1/406; H03G 3/3005
See application file for complete search history.

(56) References Cited

U.S. PATENT DOCUMENTS

| | | | |
|---|---|---|---|
| 5,335,011 A | 8/1994 | Addeo et al. | |
| 5,729,613 A * | 3/1998 | Poletti | H04S 3/002 84/630 |
| 10,210,882 B1 | 2/2019 | McCowan et al. | |
| 2001/0002930 A1 | 6/2001 | Kates | |
| 2004/0234084 A1 | 11/2004 | Isberg et al. | |
| 2005/0201204 A1 | 9/2005 | Dedieu et al. | |

(Continued)

OTHER PUBLICATIONS

ESSR issued in the related EP Application No. 19825337.9, dated Feb. 17, 2022.

*Primary Examiner* — Simon King

(57) ABSTRACT

An example method of operation may include detecting an acoustic stimulus via active beams associated with at least one microphone disposed in a defined space, detecting loudspeaker characteristic information of at least one loudspeaker providing the acoustic stimulus, transmitting acoustic stimulus information based on the acoustic stimulus to a central controller, and modifying, via a central controller, at least one control function associated with the at least one microphone and the at least one loudspeaker to minimize acoustic feedback produced by the loudspeaker.

20 Claims, 13 Drawing Sheets

(56) References Cited

U.S. PATENT DOCUMENTS

| | | | |
|---|---|---|---|
| 2005/0265560 A1 | 12/2005 | Haulick et al. | |
| 2005/0271220 A1* | 12/2005 | Bathurst | H04R 1/406 381/91 |
| 2005/0286696 A1* | 12/2005 | Bathurst | H04M 1/6033 379/202.01 |
| 2005/0286697 A1* | 12/2005 | Bathurst | H04M 1/6033 379/202.01 |
| 2005/0286698 A1* | 12/2005 | Bathurst | H04M 1/6033 379/202.01 |
| 2006/0241490 A1 | 10/2006 | Lazenby | |
| 2008/0199024 A1 | 8/2008 | Nakadai et al. | |
| 2010/0025184 A1 | 2/2010 | Shibuya et al. | |
| 2010/0215184 A1 | 8/2010 | Buck et al. | |
| 2011/0103612 A1 | 5/2011 | Chou et al. | |
| 2011/0164761 A1 | 7/2011 | McCowan | |
| 2012/0087509 A1 | 4/2012 | Elmedyb et al. | |
| 2013/0039503 A1 | 2/2013 | Beaucoup et al. | |
| 2013/0070936 A1 | 3/2013 | Jensen et al. | |
| 2013/0148821 A1* | 6/2013 | Sorensen | H04M 9/082 381/80 |
| 2013/0179163 A1 | 7/2013 | Herbig et al. | |
| 2013/0230184 A1* | 9/2013 | Kuech | H04M 9/085 381/66 |
| 2013/0259254 A1 | 10/2013 | Xiang et al. | |
| 2013/0294616 A1 | 11/2013 | Mülder | |
| 2014/0003622 A1 | 1/2014 | Ikizyan et al. | |
| 2014/0023199 A1 | 1/2014 | Giesbrecht | |
| 2014/0037100 A1 | 2/2014 | Giesbrecht | |
| 2014/0098964 A1 | 4/2014 | Rosca et al. | |
| 2014/0314251 A1 | 10/2014 | Rosca et al. | |
| 2015/0063590 A1 | 3/2015 | Katagiri | |
| 2015/0208166 A1 | 7/2015 | Raghuvanshi et al. | |
| 2016/0198258 A1 | 7/2016 | Katagiri | |
| 2016/0255446 A1 | 9/2016 | Bernardi et al. | |
| 2016/0322055 A1* | 11/2016 | Sainath | H04R 3/005 |
| 2017/0031530 A1 | 2/2017 | Ikeda et al. | |
| 2017/0278513 A1* | 9/2017 | Li | G10L 15/20 |
| 2017/0289716 A1 | 10/2017 | Mizumoto et al. | |
| 2017/0374454 A1 | 12/2017 | Bernardini et al. | |
| 2018/0070185 A1 | 3/2018 | Pedersen et al. | |
| 2018/0115650 A1 | 4/2018 | Suzuki et al. | |
| 2018/0146307 A1* | 5/2018 | Petersen | H04R 25/552 |
| 2018/0190260 A1 | 7/2018 | Christoph | |
| 2019/0027032 A1 | 1/2019 | Arunachalam | |
| 2019/0129026 A1 | 5/2019 | Sumi et al. | |
| 2019/0174226 A1 | 6/2019 | Yang et al. | |
| 2019/0349551 A1 | 11/2019 | Mughal et al. | |

* cited by examiner

US 11,863,942 B1

MICROPHONE ARRAY WITH AUTOMATED ADAPTIVE BEAM TRACKING

TECHNICAL FIELD

This application generally relates to beam forming, and more particularly, to automated beam forming for optimal voice acquisition in a fixed environment.

BACKGROUND

A fixed environment may require a sound reception device that identifies sound from a desired area using a microphone array. The environment may be setup for a voice conference which includes microphones, speakers, etc., to which a sound detection device is applied.

Conventionally, voice conference devices may receive sound (i.e., speech) from various attendants participating in the voice conference, and transmit the sound received to remote voice conferences or local speaker systems for sharing the voice of one's speech or other shared sound to be replayed in real-time for others to hear.

In a conference scenario, there are often many attendants, and a voice detection device would need to identify sound associated with each of those attendants. In addition, when the attendant(s) moves, the device would have to identify the attendant moving away from a sound-pickup area. Also, when there is a noise source, such as a projector or other noise making entity, in a conference room, the voice conference device would have a focal sound-pickup area to reduce non-desirable noise from outside that area from being captured.

Conventional approaches provide microphone arrays which have multiple beamformers that define fixed steering directions for fixed beams or coverage zones for tracking beams. The directions or zones are either pre-programmed and not modifiable by the administrators or are configurable during a setup stage. Once configured, the specified configuration remains unchanged in the system during operation. When the number of persons speaking in a particular environment changes over time and/or the positions of activities changes, the result is sub-optimal since the need for a dynamic adjustment is not addressed to match those identified changes in the environment. Also, current beamforming systems deployed in microphone arrays operate mostly in an azimuth dimension, at a single fixed distance and at a small number of elevation angles.

Audio installations frequently include both microphones and loudspeakers in the same acoustic space. When the content sent to the loudspeakers includes signals from the local microphones, the potential for feedback exists. Mix-minus configurations are frequently used to maximize gain before feedback in these types of situations. "Mix-minus" generally refers to the practice of attenuating or eliminating a microphone's contribution to proximate loudspeakers. Mix-minus configurations can be tedious to set up, and are often not set up correctly or ideally.

SUMMARY

One example embodiment may provide a method that includes initializing a microphone array in a defined space to receive one or more sound instances based on a preliminary beamform tracking configuration, detecting the one or more sound instances within the defined space via the microphone array, modifying the preliminary beamform tracking configuration, based on a location of the one or more sound instances, to create a modified beamform tracking configuration, and saving the modified beamform tracking configuration in a memory of a microphone array controller.

Another example embodiment may include an apparatus that includes a processor configured to initialize a microphone array in a defined space to receive one or more sound instances based on a preliminary beamform tracking configuration, detect the one or more sound instances within the defined space via the microphone array, modify the preliminary beamform tracking configuration, based on a location of the one or more sound instances, to create a modified beamform tracking configuration, and a memory configured to store the modified beamform tracking configuration in a microphone array controller.

Yet another example embodiment may include a non-transitory computer readable storage medium configured to store instructions that when executed cause a processor to perform initializing a microphone array in a defined space to receive one or more sound instances based on a preliminary beamform tracking configuration, detecting the one or more sound instances within the defined space via the microphone array, modifying the preliminary beamform tracking configuration, based on a location of the one or more sound instances, to create a modified beamform tracking configuration, and saving the modified beamform tracking configuration in a memory of a microphone array controller.

Still another example embodiment may include a method that includes designating a plurality of sub-regions which collectively provide a defined reception space, receiving audio signals at a central controller from a plurality of microphone arrays in the defined reception space, configuring the central controller with known locations of each of the plurality of microphone arrays, assigning each of the plurality of sub-regions to at least one of the plurality of microphone arrays based on the known locations, and creating beamform tracking configurations for each of the plurality of microphone arrays based on their assigned sub-regions.

Still yet another example embodiment may include an apparatus that includes a processor configured to designate a plurality of sub-regions which collectively provide a defined reception space, a receiver configured to receive audio signals at a central controller from a plurality of microphone arrays in the defined reception space, and the processor is further configured to configure the central controller with known locations of each of the plurality of microphone arrays, assign each of the plurality of sub-regions to at least one of the plurality of microphone arrays based on the known locations, and create beamform tracking configurations for each of the plurality of microphone arrays based on their assigned sub-regions.

Still yet another example embodiment may include a non-transitory computer readable storage medium configured to store instructions that when executed cause a processor to perform designating a plurality of sub-regions which collectively provide a defined reception space, receiving audio signals at a central controller from a plurality of microphone arrays in the defined reception space, configuring the central controller with known locations of each of the plurality of microphone arrays, assigning each of the plurality of sub-regions to at least one of the plurality of microphone arrays based on the known locations, and creating beamform tracking configurations for each of the plurality of microphone arrays based on their assigned sub-regions.

Yet another example embodiment may include a method that includes one or more of detecting an acoustic stimulus via active beams associated with at least one microphone disposed in a defined space, detecting loudspeaker characteristic information of at least one loudspeaker providing the acoustic stimulus, transmitting acoustic stimulus information based on the acoustic stimulus to a central controller, and modifying, via a central controller, at least one control function associated with the at least one microphone and the at least one loudspeaker to minimize acoustic feedback produced by the loudspeaker.

Still yet a further example embodiment may include an apparatus that includes a processor configured to detect an acoustic stimulus via active beams associated with at least one microphone disposed in a defined space, detect loudspeaker characteristic information of at least one loudspeaker providing the acoustic stimulus, a transmitter configured to transmit acoustic stimulus information based on the acoustic stimulus to a central controller, and the processor is further configured to modify, via a central controller, at least one control function associated with the at least one microphone and the at least one loudspeaker to minimize acoustic feedback produced by the loudspeaker.

Yet still another example embodiment may include a non-transitory computer readable storage medium configured to store instructions that when executed cause a processor to perform detecting an acoustic stimulus via active beams associated with at least one microphone disposed in a defined space, detecting loudspeaker characteristic information of at least one loudspeaker providing the acoustic stimulus, transmitting acoustic stimulus information based on the acoustic stimulus to a central controller, and modifying, via a central controller, at least one control function associated with the at least one microphone and the at least one loudspeaker to minimize acoustic feedback produced by the loudspeaker.

DETAILED DESCRIPTION

Figure 1A:
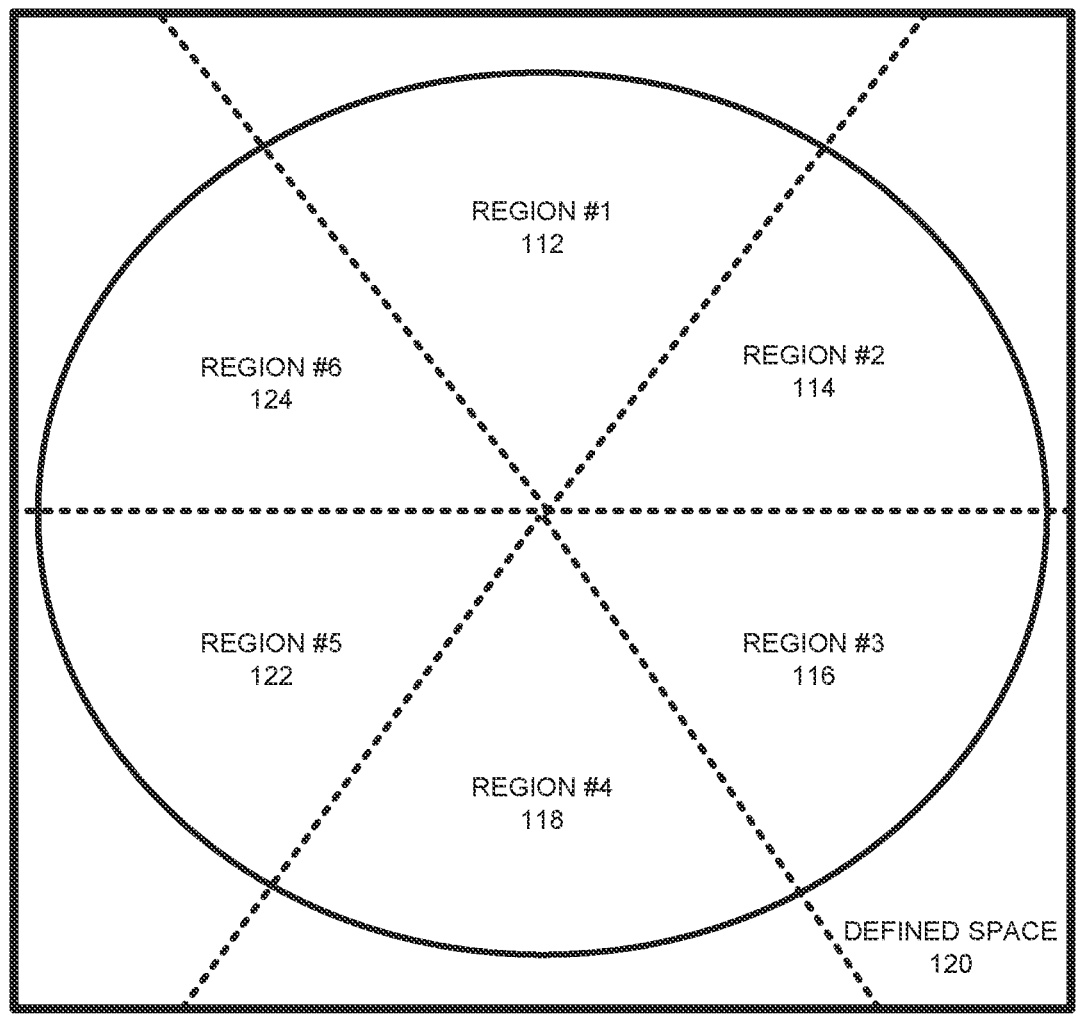
FIG. 1A illustrates a fixed environment with predefined zones/regions for capturing and processing sound according to example embodiments.

It will be readily understood that the instant components, as generally described and illustrated in the figures herein, may be arranged and designed in a wide variety of different configurations. Thus, the following detailed description of the embodiments of at least one of a method, apparatus, non-transitory computer readable medium and system, as represented in the attached figures, is not intended to limit the scope of the application as claimed, but is merely representative of selected embodiments.

The instant features, structures, or characteristics as described throughout this specification may be combined in any suitable manner in one or more embodiments. For example, the usage of the phrases "example embodiments", "some embodiments", or other similar language, throughout this specification refers to the fact that a particular feature, structure, or characteristic described in connection with the embodiment may be included in at least one embodiment. Thus, appearances of the phrases "example embodiments", "in some embodiments", "in other embodiments", or other similar language, throughout this specification do not necessarily all refer to the same group of embodiments, and the described features, structures, or characteristics may be combined in any suitable manner in one or more embodiments.

In addition, while the term "message" may have been used in the description of embodiments, the application may be applied to many types of network data, such as, packet, frame, datagram, etc. The term "message" also includes packet, frame, datagram, and any equivalents thereof. Furthermore, while certain types of messages and signaling may be depicted in exemplary embodiments they are not limited to a certain type of message, and the application is not limited to a certain type of signaling.

Example embodiments provide a voice tracking procedure which is applied to microphone arrays disposed in a fixed environment, such as a conference room. The arrays are centrally managed and controlled via a central controller (i.e., server, computer, etc.). In another example, the arrays may be centrally managed and controlled with one of the arrays acting as a central controller and/or a remote controller outside the arrays. Location data from the microphone array will be 3-dimensional, including azimuth, elevation and distance coordinates. This represents an extension over current beamforming systems, which operate mostly in the azimuth dimension, at a single fixed distance and at a small number of elevation angles.

Validation of the accuracy of the location data may be provided by a tracking beamformer module which is part of the microphone array(s). The distance dimension may be included in the calculations to inform both the digital signal processing (DSP) algorithm development and specification of relevant product features. Beamforming procedures and setup algorithms may be used to define a discrete search space of beamforming filters at defined locations, referred to as a filter grid. This grid is defined by a range and number of points in each of three spherical coordinate dimensions including azimuth, elevation and distance.

Compared to previous attempts at beam forming in a conference room environment and similar environments, a major distinction in the present example embodiments is a requirement to cover a larger area. The information produced by the tracker must include not just azimuth and elevation angles, but also a distance to the talker, thus creating three dimensions of beam forming considerations. Two complementary but discrete functions of the tracking algorithm may provide steering the array directivity pattern to optimize voice quality, and producing talker location information for certain purposes, such as user interfaces, camera selection, etc.

FIG. 1A illustrates a fixed environment with predefined zones/regions for capturing and processing sound according to example embodiments. Referring to FIG. 1A, the room or defined space may be a circle, square, rectangle or any space that requires beamforming to accommodate speaker and microphone planning for optimal audio performance. In this example 100A, the room is identified as being substantially square or rectangular with the circular portion representing a coverage area of the microphones. The size of the regions 112-124 extend into the entire area defined by the dotted lines and the boundaries of the square/rectangular area of the room. The room is a defined space 120. One skilled in the art would readily identify that any room shape or size may be a candidate for beamforming and multiple microphone array setup configurations.

Figure 1B:
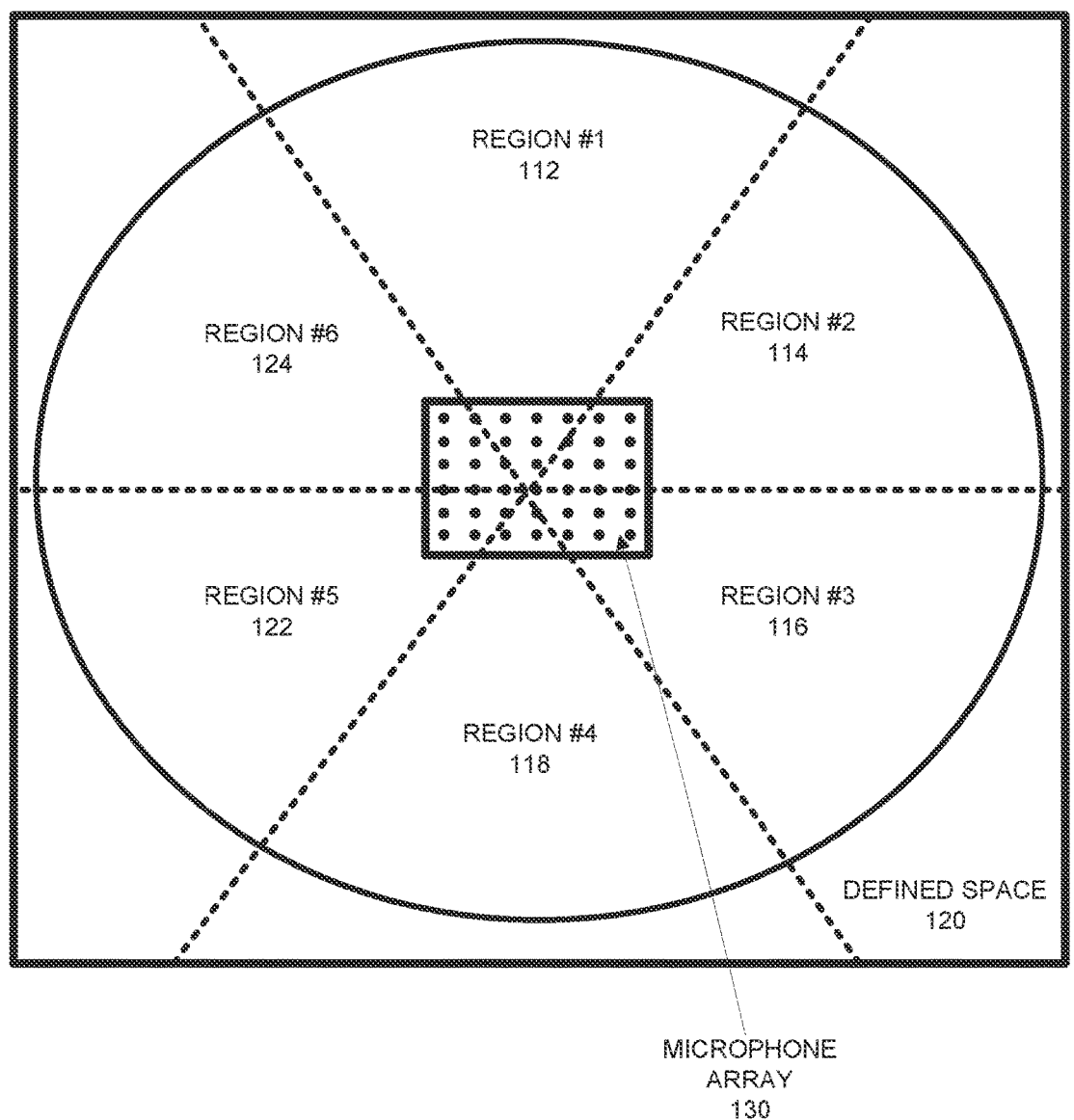
FIG. 1B illustrates a fixed environment with predefined zones/regions for capturing and processing sound with a microphone array according to example embodiments.

FIG. 1B illustrates a fixed environment with predefined zones/regions for capturing and processing sound with an example set of microphones according to example embodiments. Referring to FIG. 1B, the configuration 100B provides six regions which are populated with microphones and/or microphone arrays. In various examples including tests and procedures which were performed leading up to this disclosure a microphone array may include a multi-microphone array 130 with a large density of the microphones in the center of the room. In this example, only a limited number of microphones were shown to demonstrate the spatial distances between microphones and the variation in densities of microphones throughout the room. However, one skilled in the art would readily recognize that any number of microphones could be used to spatially align the audio sound capturing actions of the various microphones in an optimal configuration depending on the nature of the sound. This example provides a centrally located microphone array 130 being in a center room location with various room 'zones'. In actuality, the zones/regions of the room or other space (e.g., 112-124) are generally much larger than the actual microphone array dimensions, which is generally, but not necessarily, less than one meter. The array may be on the order of 5 cm to 1 m in length/width/radius, while the coverage zones may extend 1 m-10 m or more. In general, the zones/regions should cover the room centered on the array, and each microphone array will cover a smaller area of the entire room.

When estimating distance from a single microphone array for a given steering direction, given by both azimuth and elevation angles, the ability of a microphone array to distinguish different talker location distances using a steered response power and/or time delay method, depends on its ability to distinguish the curvature of the sound wave front. This is illustrated in the following examples of FIGS. 1C and 1D. It can be observed that the impact of the wave front curvature is more significant for closer sources, leading to greater distance differences.

Figure 1C:
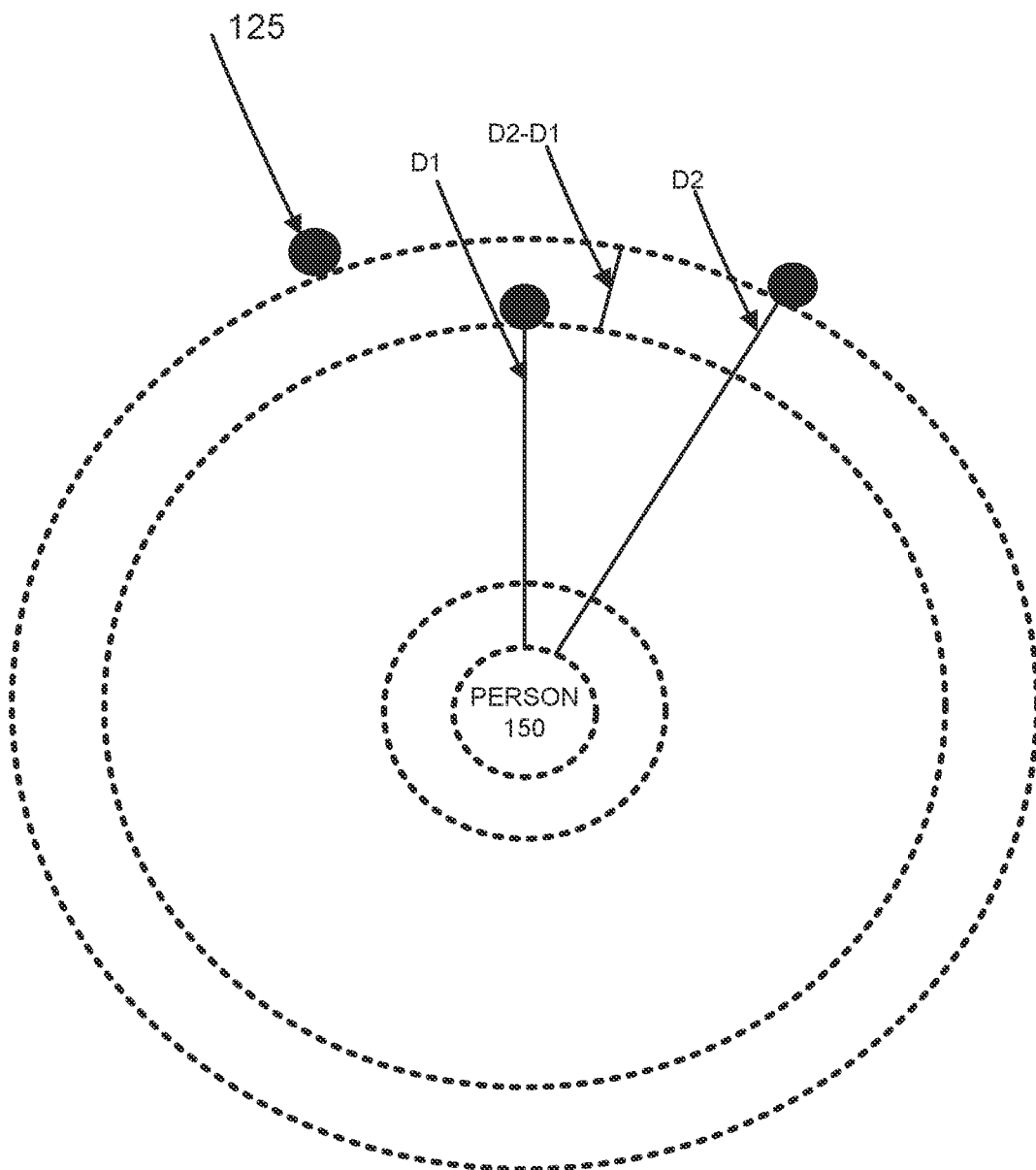
FIG. 1C illustrates a fixed environment with microphone arrays identifying distances and capturing and processing sound according to example embodiments.

FIG. 1C illustrates a fixed environment with microphones identifying distances and capturing and processing sound according to example embodiments. Referring to FIG. 1C, the illustration 100C includes a person 150 located and speaking in the center of the array position with microphones 125 located at a first distance D1 away from the person 150 and at a second distance D2. The difference between those distances is D2-D1.

Figure 1D:
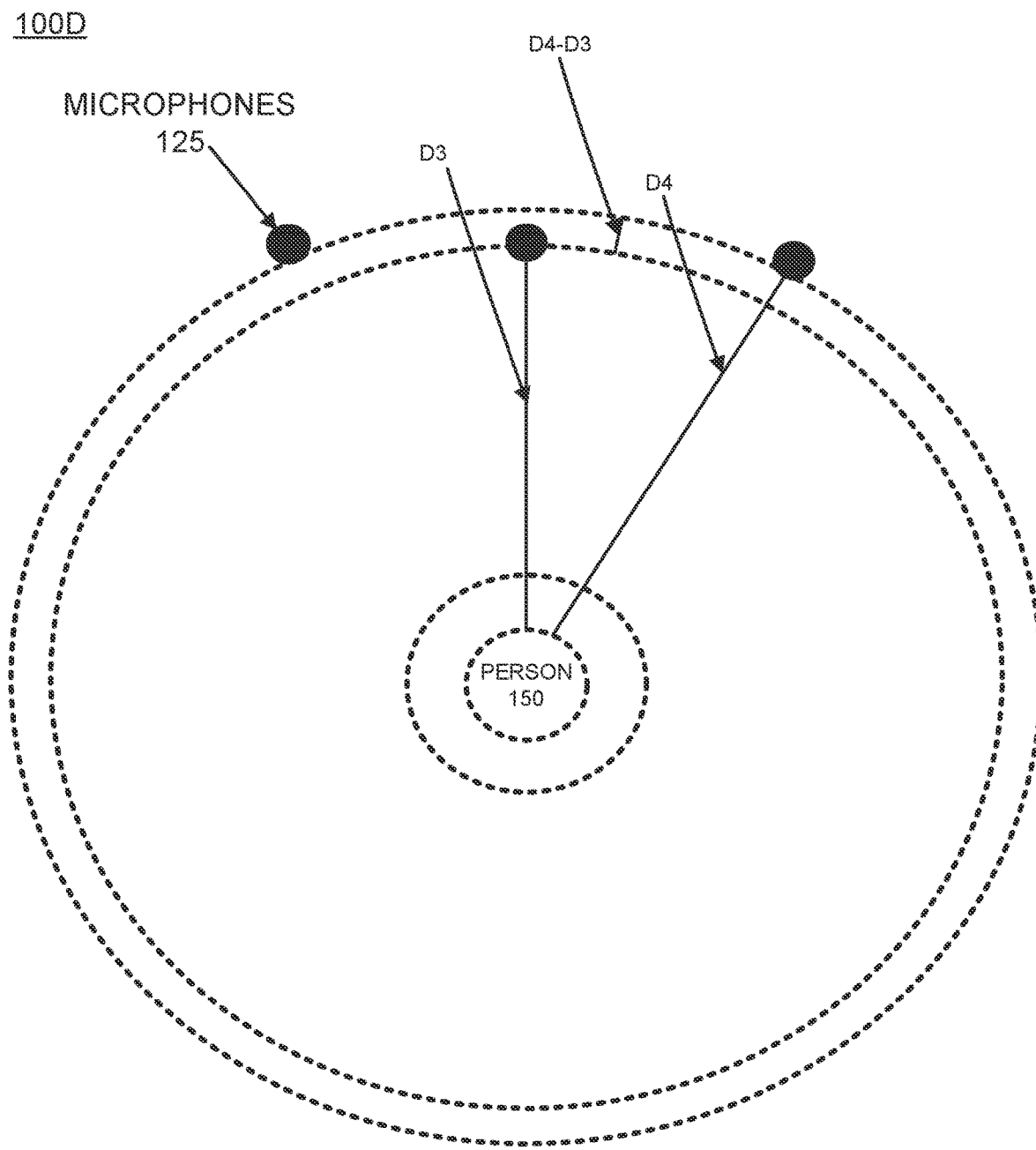
FIG. 1D illustrates a fixed environment with microphone arrays identifying distances and capturing and processing sound from a larger distance according to example embodiments.

FIG. 1D illustrates a fixed environment with microphones identifying distances and capturing and processing sound from a larger distance according to example embodiments. Referring to FIG. 1D, the example 100D includes a scenario where the person 150 is further away from first and second microphones 125, the respective distances being D3 and D4 and the differences between those distances D4-D3 is smaller than the distance between D2 and D1 as in FIG. 1C, (i.e., |D2−D1|>|D4−D3| in the example). When a person is close to a microphone(s) (i.e., in the near-field), a change in distance can lead to a measurable difference/delay in times of arrival (TDOA), so it is possible to resolve different distances within the microphone array. As the person moves away towards the array's far-field, a change in distance no longer makes a measurable difference to the TDOA. As the source becomes further from the microphones the array transcribes a progressively shorter arc of the wave front, diminishing the ability to resolve distances. At a certain distance (relative to the array length) the wave front can be assumed to behave like a planar wave, which makes distance detection based on time delays difficult to process, as there is no dependence on the source distance in plane wave propagation.

The preceding example is formalized by distinguishing the near field and far field of a microphones. In the near field, the wave behaves like a spherical wave and there is therefore some ability to resolve source distances. In the far field, however, the wave approximates a plane wave and hence source distances cannot be resolved using a single microphone array. The array far field is defined by: $r>(2L^2)/\lambda$, where 'r' is the radial distance to the source, 'L' is the array length, and '$\lambda$' is the wavelength, equivalently, c/f where 'c' is the speed of sound and 'f' is frequency. In practice, while some distance discrimination may be achieved for sources within a certain distance of the array, beyond that distance all sources are essentially far-field and the steered response power will not show a clear maximum at the source distance. Given the typical range of talkers for array configuration use cases, it may be imprecise when attempting to discriminate distance directly using steered response power from a single array.

With regard to the tracking example described above, in terms of the purpose of optimizing voice quality by beamforming, there is, therefore, not considered to be any significant audio benefit from beamforming filters calculated at different distances due to the difficulties of resolving a distance dimension. Instead, a single set of beamforming filters optimized for far-field sources provide the most consistent audio output and constrain the tracking search to only operate over azimuth and elevation angles. Nonetheless, for the secondary purpose of providing talker location information for other uses, it is still desirable to estimate distance to some resolution.

In order to achieve talker location information, projection of distance based on elevation angle and assumed average vertical distance between array and talker head locations, and/or a triangulation of angle estimates from multiple microphone array devices in the room may be performed. In this approach, the microphone array should be mounted in the ceiling or suspended from the ceiling, target source locations are the mouths of people that will either be standing or sitting in the room (see FIG. 1E).

Figure 1E:
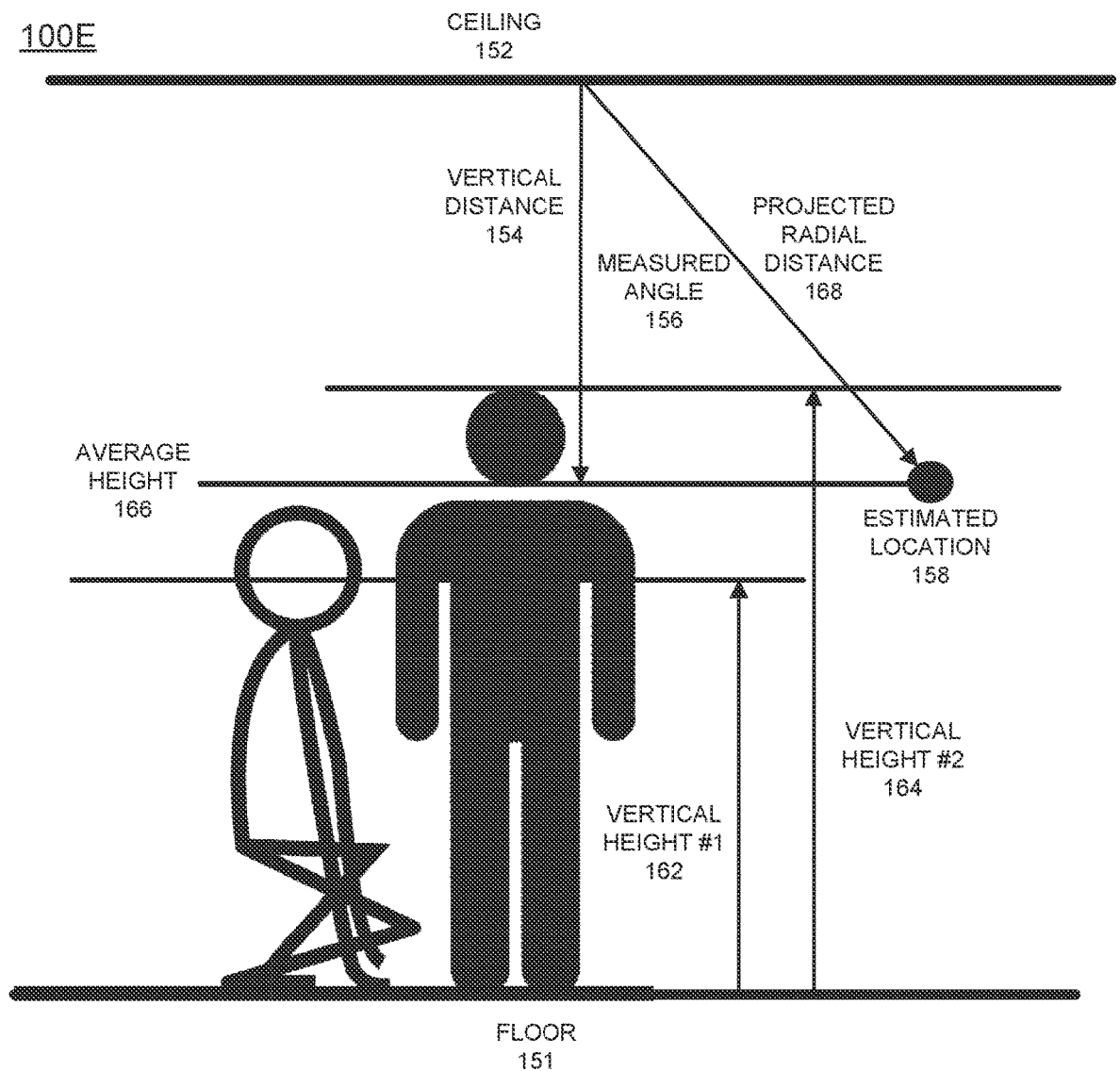
FIG. 1E illustrates a fixed environment with microphone arrays identifying sound based on assumed vertical heights according to example embodiments.

FIG. 1E illustrates a fixed environment with microphone arrays identifying sound based on assumed vertical heights according to example embodiments. Referring to FIG. 1E, the configuration 100E provides a floor 151, a ceiling 152, an average height 166 of persons mouths, such as distance average of sitting persons 162 and standing persons 164. A height of the array from the floor (i.e., ceiling) may be specified. A vertical distance from the ceiling 154 may be set based on this average. The azimuth and elevation angle 156 can be estimated accurately using the existing steered response power method. Given this configuration, the radial 168 and horizontal distance of the estimated location 158 between the array and a talker may be projected based on the measured elevation angle 156 and an assumed average vertical distance 154 between the array and typical voice sources. The distance estimation error will be determined by the resolution of the elevation estimation and also real variance in talker heights compared to the assumed average height at resolutions that are acceptable for a range of purposes such as visualization in a user interface (see FIG. 2).

Figure 1F:
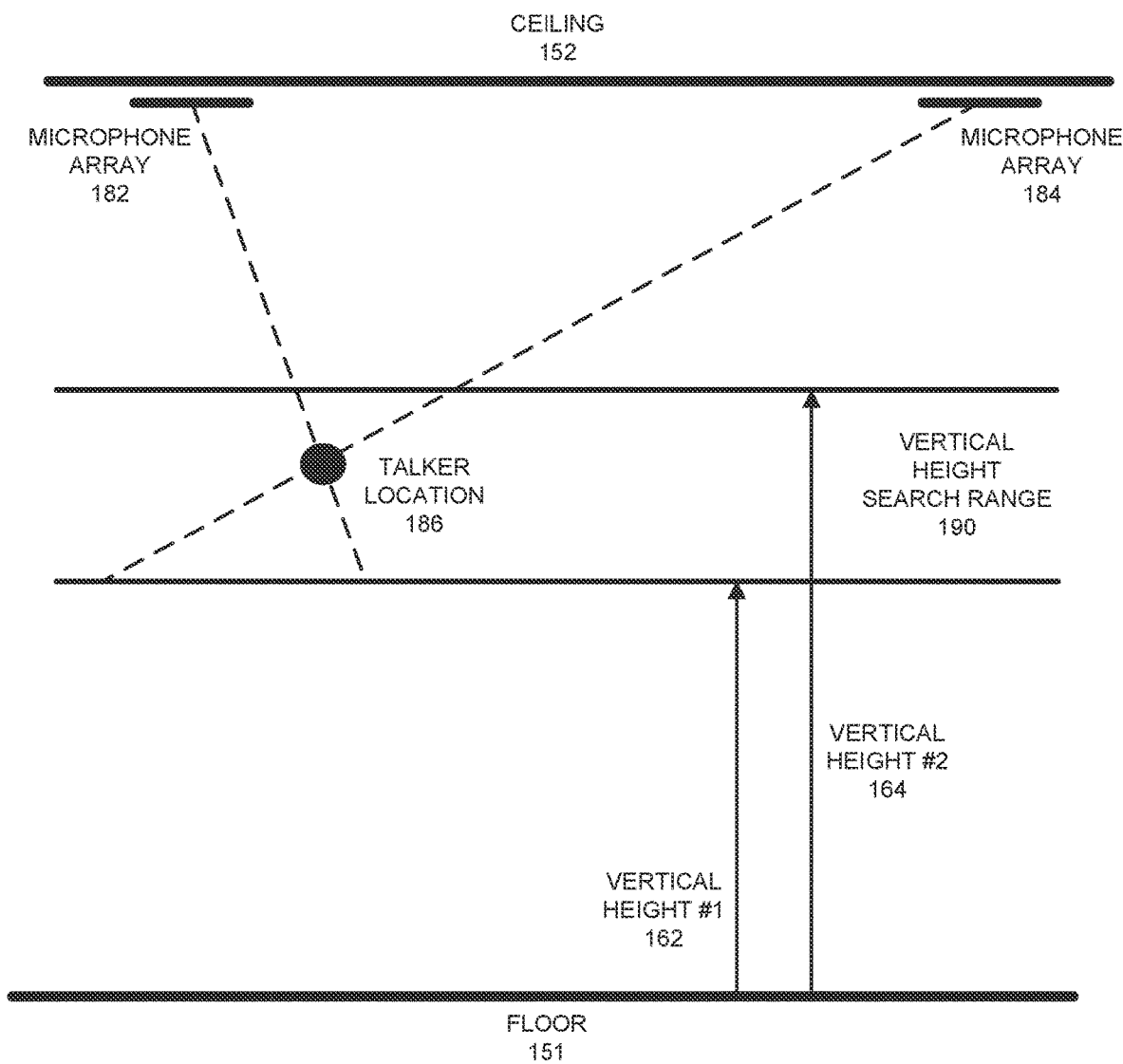
FIG. 1F illustrates a fixed environment with microphone arrays identifying sound based on assumed vertical heights and using triangulation to identify talker locations according to example embodiments.

FIG. 1F illustrates a fixed environment with microphone arrays identifying sound based on assumed vertical heights and using triangulation to identify talker locations according to example embodiments. Referring to FIG. 1F, in the case when there are multiple microphone array devices in the same space/room, the above scenario could theoretically be extended to permit a more precise talker location to be determined using triangulation. The example 100F includes two microphones arrays 182 and 184 affixed to the ceiling 152 and identifying a talker location via two separate sources of sound detection. The talker location 186 may be an average height between the two vertical heights 162 and 164. The vertical height search range 190 may be the area therebetween those two distances.

For the resolution and dimensionality of the search grid, as seen previously, there is negligible ability to resolve distances with a single microphone array device due to the far-field nature of the voice sources. The larger microphone array according to example embodiments, provides increased resolution in azimuth and elevation, particularly in higher frequencies, for reasons of voice clarity, the actual beam filters in such a case may be designed to target a 3 dB beamwidth of approximately 20-30 degrees. For this reason, a grid resolution of 5 degrees in both azimuth and elevation may be considered to be a practical or appropriate resolution for tracking, when there is unlikely to be any noticeable optimization in audio quality by tracking to resolutions beyond that level. This possible resolution may lead to 72 points in the azimuth dimension (0 to 355 degrees) and 15 points in the elevation dimension (5 to 75 degrees), giving a total grid (i.e., energy map) size of 1080 distinct locations. If a 6-degree resolution, is instead used, in both dimensions, the grid size decreases to 780 points (60 points in azimuth, 13 points in elevation from 6 to 78 degrees), which is approximately a 25% reduction in computational load.

According to example embodiments, the microphone array may contain 128 microphones for beamforming, however, as tracking only uses a single energy value over a limited frequency band, it is not necessary to use all of those microphones for tracking purposes. In particular, many of the closely spaced microphones may be discarded as the average energy over the frequency band will not be overly influenced by high frequency aliasing effects. This is both because a high frequency cut-off for the tracker calculations will eliminate much of the aliasing, and also because any remaining aliasing lobes will vary direction by frequency bin and hence averaging will reduce their impact. One example demonstrates a full 128-microphone array, and an 80-microphone subset that could be used for energy map tracking calculations. This is a reduction in computational complexity of approximately 35% over using a full array.

The tracking procedure is based on calculating power of a beam steered to each grid point. This is implemented in the FFT domain by multiply and accumulate operations to apply a beamforming filter over all tracking microphone channels, calculating the power spectrum of the result, and obtaining average power over all frequency bins. As the audio output of each of these beams is not required by the tracking algorithm, there is no need to process all FFT bins, and so computational complexity can be limited by only calculating the power based on a subset of bins. While wideband voice has useful information up to 7000 or 8000 Hz, it is also well-known that the main voice energy is concentrated in frequencies below 4000 Hz, even as low as 3400 Hz in traditional telephony.

Further, it may only be necessary to calculate the phase transformed microphone inputs on 80 microphones, once every N frames and stored for use with all grid points. Hence the computational complexity of the input for the loop will be reduced by a factor of 1/N. To spread the computational load, the transformed microphone inputs may be calculated for one audio frame callback, and then update the energy map based on that input over the following 15-20 audio frames. This configuration provides that the full grid energy map will be updated at a rate of 20-40 fps, i.e., updated every 25 to 50 milliseconds. Voiced sounds in speech are typically considered to be stationary over a period of approximately 20 milliseconds, and so an update rate on the tracker of 50 milliseconds may be considered as sufficient. Further computational optimizations may be gained by the fact that the noise removal sidechain in the tracking algorithm needs to only be applied over the tracking microphone subset, e.g., 80 microphones instead of the full 128 microphones. The steered response power (SRP) is calculated at every point of the search grid over several low rate audio frames. Having access to the audio energy at each point of the grid permits a combination over multiple devices, assuming relative array locations are known. This also facilitates room telemetry applications.

According to example embodiments, the beamforming and microphone array system would be operated as one or more arrays in a single reception space along with a master processing system. At a new installation, the master processing system or controller would initiate an array detection process in which each array would be located relative to the other arrays through emitting and detecting some calibration signal, optionally, this process may be performed via a user interface instead of through this automated process. The master would then know the relative locations of each array. The process would have then likely emitted a similar calibration signal from each loudspeaker in the room to determine relative locations or impulse response to each loudspeaker. During operation (i.e., a meeting), each array would calculate a local acoustic energy map. This energy map data would be sent to the master in real-time. The master would merge this into a single room energy map. Based on this single room energy map, the master would identify the main voice activity locations in a clustering step, ignoring remote signals in the known loudspeaker locations. It would assign the detected voice locations to the nearest array in the system. Each array would be forming one or more beam signals in real-time as controlled by this master process. The beam audio signals would come back from each array to the master audio system which would then be responsible to automatically mix them into a room mix signal.

Example embodiments provide a configuration for initializing and adapting a definition of a microphone array beamformer tracking zone. The beamforming is conducted based on voice activity detected and voice location information. The configuration may dynamically adjust a center and range of beamforming steering regions in an effort to optimize voice acquisition from a group of talkers within a room during a particular conversation conducted during a meeting.

Localized voice activity patterns are modeled over time, and zone definitions are dynamically adjusted so that default steering locations and coverage ranges for each beam corresponds to the expected and/or observed behavior of persons speaking during the conference/event. In one example, predefined zones of expected voice input may be defined for a particular space. The zones may be a portion of circle, square, rectangle or other defined space. The dynamic zone adjustment may be performed to accommodate changes in the speaking person(s) at any given time. The zone may change in size, shape, direction, etc., in a dynamic and real-time manner. The zones may have minimum requirements, such as a minimum size, width, etc., which may also be taken into consideration when performing dynamic zone adjustments.

In another example, a number of talkers or persons speaking at any given time may be identified, estimated and/or modeled over a period of time. This ensures stable mixing and tracking of beams zones with active talkers as opposed to zones which are not producing audible noise or noise of interest. Automating the allocation of beam locations and numbers, the configuration used to accommodate the event may be selected based on the event characteristics, such as center, right, left, presentation podium, etc., instead of at the 'per-beam' level. The controller would then distribute the available beams across those conceptual areas in a dynamic distribution to optimize audio acquisition according to actual usage patterns. Also, the zones may be classified as a particular category, such as "speech" or "noise" zones. An example of noise zone classification may be performed by detecting a loudspeaker direction using information from AEC or a calibration phase and/or location prominent noise sources during a non-speech period. The noise zones may then be suppressed when configuring a particular mix configuration, such as through a spatial null applied in the beamformer.

Example embodiments provide minimizing beam and zone configuration time for installers since the automation and dynamic adjustments will yield ongoing changes. The initialization provides for uniformly distributed zones and then adaptation during usage to adjust to the changes in the environment. This ensures optimal audio output being maintained for evolving environment changes.

One approach to configuring a modular microphone array is to provide a three-dimensional approach to adjusting the beams, including azimuth, elevation and distance coordinates. A setup configuration of physical elements may provide a physical placement of various microphone arrays, such as, for example two or more microphone arrays in a particular fixed environment defined as a space with a floor and walls. The automated configuration process may be initiated by a user and the resulting calibration configuration parameters are stored in a memory accessible to the controller of the microphone arrays until the calibration configuration is deleted or re-calculated. During the calibration configuration process, the microphone arrays may either take turns emitting a noise, one at a time, or each microphone array may emit a noise signal designed to be detected concurrently (e.g., different known frequency range for each device, or different known pseudo-random sequence). The "noise" may have been a pseudo-random "white" noise, or else a tone pulse and/or a frequency sweep. One example provides emitting a Gaussian modulated sinusoidal Pulse signal from one device and detected using a matched filter on another device within the arrays, however, one skilled in the art would appreciate other signal emissions and detections may be used during the setup calibration phase.

The calibration and coordinating process would run on a master processor of the controller (e.g., a personal computer (PC) or an audio server) that has access to audio and data from all devices. While a master process will need to coordinate the processing, some of the processing may be performed on each of the microphone arrays via a memory and processor coupled to each microphone array device. During the calibration process, relative locations of the microphone arrays may be established in a single coordinate system. For example, one array may be designated as an origin (i.e., (x, y, z)) with a (0, 0, 0) reference and other microphone arrays will be located with corresponding Cartesian coordinates with respect to this origin position. Knowing relative locations will permit merging of beam tracking zones across multiple arrays and determining which array "owns" each beam when performing actual beamforming, which also provides input for automatic beam mixing and gain control procedures. The calibration procedure may require ranging of signals for a few seconds per microphone array, however, the entire process may require a few minutes.

One example result may reduce mixing of multiple out-of-phase versions of the same voice to reduce feedback an unwanted audio signals. When the arrays work independently and each track the same voice at a given time, the result can be unfavorable. Due to different physical locations, a person's voice originated from a common location would have different phase delays at each microphone array, this in turn, would lead to voice degradation from a comb filtering type effect. Another objective may be to have the closest microphone array responsible for forming an audio beam for a given talker. Proximity to the talker will optimize the signal to noise ratio (SNR) compared to a more distant microphone array.

One example embodiment may provide optimizing the accuracy of a beam tracking operation by discerning distances by triangulating distances between multiple microphone arrays based on energy tracking. The distances and energy information may be use for deciding which array unit is responsible to provide a beamformed signal to a particular voice source (person). The method may also include determining mixing weights for merging the various beam signals originating from multiple microphone arrays into a single room mixed signal.

The adaptation of voice may be based on actual live event data received from the event room as a meeting occurs, such a procedure does not require samples of audio and/or performing calibration of beam positions in a setup stage prior to a conference event. The system provides dynamic and ongoing adjustments among the microphone arrays based on the data received regarding locations of speakers, background noise levels, direction of voices, etc. An initial room condition may require an initial condition, which could be a uniform distribution of 'N' beam zones around 360 degrees (i.e., 360/N degrees apart) and/or a stored distribution based on a final state from a previous event, and/or a preset configuration that was created and saved through a user interface, or created by sampling voices in different places of the event room.

As the meeting begins, the array may automatically adapt the beam tracking zones according to detected voice locations and activity in the room over a certain period of time. For instance, the process may proceed with four beams at 0, 90, 180 and 270 degrees, each covering +/−45 degrees around a center point. Then, if someone begins talking at a 30-degree angle, the first beam zone will gradually adapt to be centered on 30 degrees+/−some range, and the other three beams will adjust accordingly. An initial condition may provide a beam zone distribution of four uniformly spaced zones as an initial condition, however, six may also be appropriate depending on the circumstances. There may be some changes to the center and range of some of the zones after some live usage activity to account for actual talker locations during a meeting.

According to another example embodiment, multiple microphone array devices (modules) may be strategically arranged in a single room or 'space'. Those modules may be identified by a central controller as being located in a particular location and/or zone of the room. The modules may also be aware of their position and other module positions throughout the space. Location information may be used to provide a joint beamforming configuration where multiple microphone arrays provide and contribute to a single beamform configuration. The modules or central controller may perform intelligent mixing of beamformed audio signals and voice tracking data. The grouping of modules in a single room and their configuration and relative position/locations and orientation may be automatically configured and adjusted by a process that jointly detects calibration signals emitted from each device. The calibration signals may be spoken words by a speaker, pulses sent from the speakers in the room or speakers associated with the modules, etc.

Figure 2:
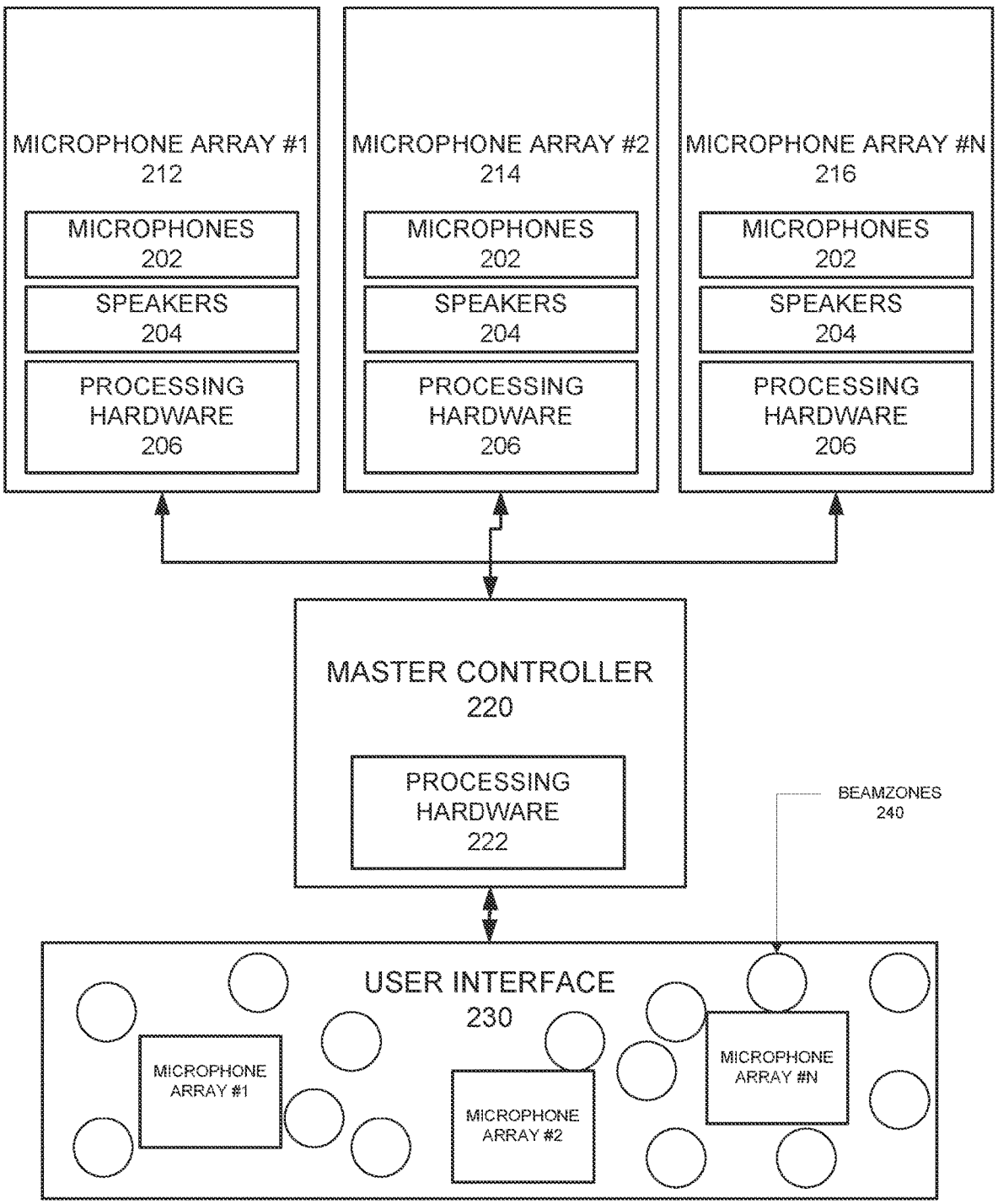
FIG. 2 illustrates an example microphone array and controller configuration according to example embodiments.

FIG. 2 illustrates an example microphone array configuration and corresponding control function according to example embodiments. Referring to FIG. 2, the configuration 200 includes various microphone arrays 212-216 disposed in the event space or room. The microphone arrays may include microphones 202, speakers 204 and processing hardware 206, such as processors, memory, transmitter/receivers, digital interfaces, etc., to communicate with other devices. A master controller device 220 may receive information from each microphone array either from a wired or wireless medium and use processing hardware 222 to process data signals and provide results. The master controller may include processing hardware, such as processors, memory and other components necessary to process and make changes to the dynamic microphone array configuration. A user interface 230 may be based on a software application which displays information, such as microphone array positions, and current beamzones 240. The changes to the beamzones or beam forms may be identified and updated in the user interface as the master controller reconfigures the room configuration based on sound fingerprints and noise characteristics. Examples of loudspeaker characteristics may include certain loudspeaker properties, loudspeaker coupling information, loudspeaker location information, etc. Other examples may include characteristics of the loudspeaker output and/or characteristics of the noise in a particular room or environment caused by the loudspeaker but taking into effect the noise identified in the room not just noise received directly from the loudspeaker.

In general, there may be some physical separation between the arrays 212, 214 and 216. One approach may provide separating the arrays by one meter from one another. This configuration may include the modules being directly adjacent to one another. During a joint beamforming configuration, all microphone elements of all arrays may be participating in one or more beamforms used to capture audio from various parts of the room. The controller 220 may incorporate one, some or all of the microphone array elements into any number of joint beamforms to create one large array of beamforming. Beamformer steering directions and tracking zones are created and managed for all the microphone arrays so that multiple arrays may be performing a single joint beamforming activity.

According to another example embodiment, a microphone array and speaker system may utilize an automated location-based mixing procedure to reduce undesirable feedback from occurring in a predefined space. The configuration may include one or more microphone arrays or array devices and multiple speakers used for local reinforcement so the active beam location from a microphone array is used to invoke an automated mixing and reduction (mix-minus) procedure to reduce relative feedback of a person(s)'s voice as it is amplified through the room speakers. Detecting locations of the speakers in the room relative to the microphone arrays may be performed to determine certain characteristics of the potential for noise feedback and the degree of correction necessary. In operation, calibration signals may be emitted from the speakers and detected to identify speaker locations with respect to the various microphone arrays. Delays may also be determined to identify characteristics between microphones and speakers in the room. In another example, the calibration signals may be emitted from speakers that are not necessarily physically co-located in the microphone array device.

In one example embodiment, a DSP processing algorithm may be used to automate the configuration of a mixing and substracting system to optimize for gain before feedback occurs. The process of feedback occurs when the gain of a microphone-loudspeaker combination is greater than 0 dB at one or more frequencies. The rate at which feedback will grow or decay is based on the following formula: R=G/D, where: "R" is the feedback growth/decay rate in dB/sec (i.e., how quickly the feedback tone will get louder or softer), "G" is the acoustic gain of the microphone-loudspeaker combination in dB (i.e., the difference between the level of a signal sent to the DSP output and the level of the same signal received by the microphone at the DSP input), and "D" is the delay of the microphone-loudspeaker combination (i.e., elapsed time between when a signal is picked up by a microphone, output by the loudspeaker, and arrives back at the microphone—in seconds).

Since delay is always a positive value, the gain of the microphone-loudspeaker combination must be greater than 0 dB for feedback to occur. However, if the gain is negative but still relatively close to 0 dB, the feedback decay rate will be slow and an undesirable, audible "ringing" will be heard in the system. For instance, if the gain of a microphone-loudspeaker combination is −0.1 dB and its delay is 0.02 seconds (20 mS), then feedback will decay at a rate of 5 dB/sec, which is certainly audible. If a level of the microphone's contribution is reduced to that loudspeaker by 3 dB, then feedback will decay at a much faster rate of 155 dB/sec. Feedback is frequency-dependent. Feedback creates resonances at periodic frequencies, which depend on delay time, and feedback will first occur at those resonant frequencies. If a DSP algorithm has the ability to measure the inherent gain and delay of a microphone-loudspeaker combination, it can manage the rate of feedback decay in the system by modifying the gain or modifying the delay, except that modifying delay would likely have undesirable side effects. Such an algorithm can maximize the level of the microphone's signal being reproduced by the loudspeaker while minimizing the potential for feedback.

The proposed algorithm/procedure is designed to maximize gain before feedback, however it is important to note that this mix and subtraction system is used for more than just maximizing gain before feedback. For instance, this algorithm should not be expected to maximize speech intelligibility or to properly set up voice lift systems, for example, where the reinforcement system is not designed to be "heard", the listener still perceives the sound as originating from the talker. This requires much more knowledge of the relative distances between the talker and listener, and between the listener and loudspeaker. Maximizing gain before feedback is not the only task required to properly set up such a system. For instance, this algorithm/procedure should not be expected to properly set up the gain structure of an entire system or correct for poor gain structure.

The procedure may be setup so the cross-point attenuations within a matrix mixer such that gain before feedback is maximized. In order to perform this function, the algorithm first needs to measure the gain of each microphone-loudspeaker combination. The procedure will output a sufficiently loud noise signal out of each speaker zone at a known level, one zone at a time. It will then measure the level of the signal received by each microphone while that single speaker (or zone of speakers) is activated. The gain measurements are taken while the microphone is routed to the speaker, because the transfer function of the open-loop system (i.e., where no feedback is possible) will be different than the transfer function of the closed-loop system. In order for the procedure to calculate the exact feedback decay rate of each microphone-loudspeaker combination, it would also need to measure the delay of each combination. However, measuring the delay of a microphone-loudspeaker combination may be more complicated than simply measuring the gain and/or may require different test signals. Furthermore, for our purposes, we can assume that the delay will be reasonably small (e.g., less than 50 milliseconds) for any microphone-loudspeaker combination that actually has enough gain that could become feedback.

The microphone array may be used to locate the speakers for purposes of estimating delay and/or gain correction. Detecting locations of the speakers in the room relative to the microphone arrays may be performed to determine certain characteristics of the potential for noise feedback, gain, and/or a relative degree of correction necessary. In operation, calibration signals may be emitted from the speakers and detected to identify speaker locations with respect to the various microphone arrays. Delays may also be determined to identify characteristics between microphones and speakers in the room. In another example, the calibration signals may be emitted from speakers that are not necessarily physically co-located in the microphone array device.

Therefore, if the acoustic gain of the microphone-speaker combination is less than some threshold value (e.g., 3 dB), then the feedback decay rate will be acceptable and "ringing" won't be audible. For this reason, measuring the delay of each microphone-loudspeaker combination will be unnecessary. Once the algorithm has measured the gain of each microphone-loudspeaker combination, it must check to see if any combinations have an acoustic gain that is greater than the threshold value (−3 dB). For any combinations with a gain greater than the threshold value, the algorithm will attenuate the matrix mixer crosspoint corresponding to that combination by a value which will lower the gain below the threshold value. For any combinations with an acoustic gain that is already less than the threshold value, the algorithm will pass the signal through at unity gain for the corresponding crosspoint and no positive gain will be added to any crosspoint.

Figure 3:
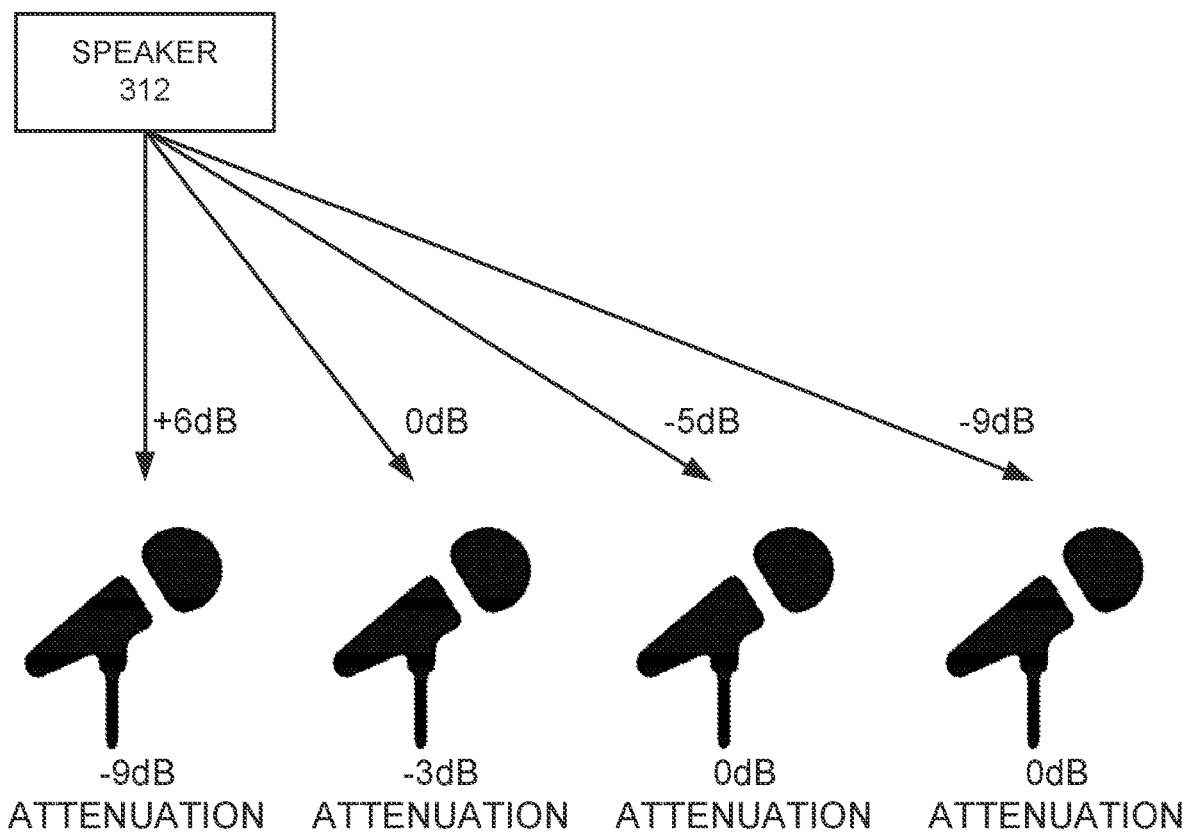
FIG. 3 illustrates attenuation application performed by the controller according to example embodiments.

FIG. 3 illustrates attenuation application performed by the controller according to example embodiments. More specifically, the process would populate the crosspoint levels of the matrix mixer by a process. The example 300 provides that a speaker 312 will have microphones with varying attenuation and measured dB s depending on location in an effort to approximate −3 dBs. Attentuation cannot be set beyond 0 dB. Assume the system has m microphones and n loudspeakers. Therefore, the process has to populate the crosspoint levels of a (m×n) matrix mixer. Each of the n loudspeakers can be a single loudspeaker or a discrete zone of multiple loudspeakers that are fed from the same output. First, the process measures the gain of each microphone-loudspeaker pair. It will perform this by generating a noise signal of a known level and sending it to a single loudspeaker or zone of loudspeakers, and measuring how much of that signal is received by each of the m microphones. The gain, 'G', of each loudspeaker-microphone pair is calculated as: $G(m, n)=L\_in-L\_out$, where: $G(m, n)$ is the measured gain between microphone 'm' and loudspeaker 'n'. L_out is the level of the generated noise signal, in dBu. Specifically, this is the level of the signal as it leaves the matrix mixer block, before any processing is applied. 'L_in' is the level of the signal received by the microphone after applying mic preamp gain and any input processing, in dBu. In other words, it is the level of the microphone signal as it is received at the input of the matrix mixer. This process is repeated for all n loudspeakers until the gain is measured for all m, n pairs. Then, the procedure will populate the crosspoint levels of the matrix mixer according to the following formula: $L(m,n)=\{(G\_max-G(m,n), G(m,n)>G\_max;$ and $0, G(m,n) \leq G\_max)$. The values are defined as: $L(m, n)$ is the crosspoint level applied to the crosspoint (m, n), Gmax is the maximum allowable loudspeaker-microphone gain, somewhere in the range of −3 to −6 is an acceptable value, and $G(m, n)$ is the measured gain between microphone m and loudspeaker n.

Figure 4A:
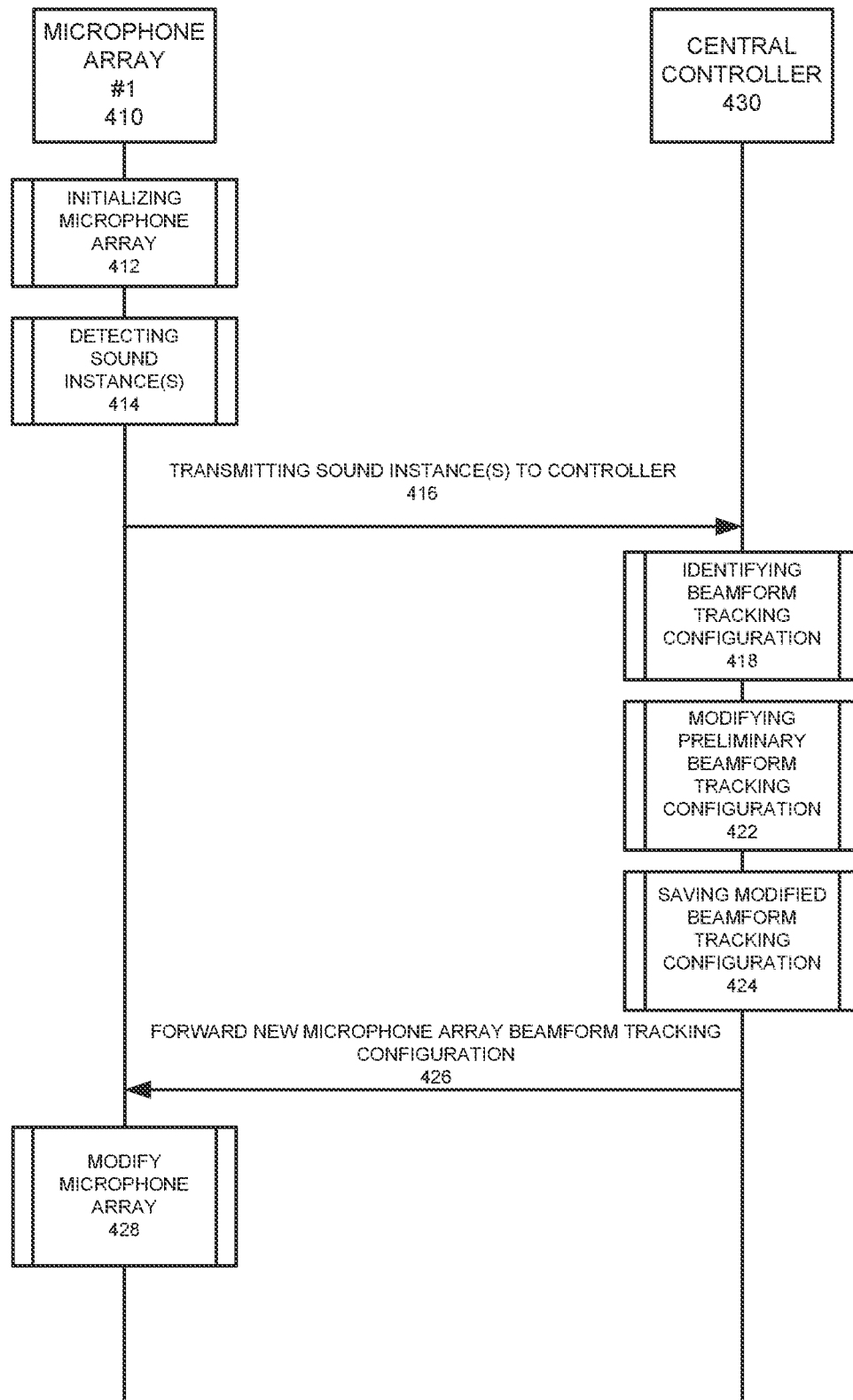
FIG. 4A illustrates a system signaling diagram of a microphone array system with automated adaptive beam tracking regions according to example embodiments.

FIG. 4A illustrates a system signaling diagram of a microphone array system with automated adaptive beam tracking regions according to example embodiments. Referring to FIG. 4A, the system 400A includes a microphone array 410 in communication with a central controller 430. The process includes initializing a microphone or microphone array in a defined space to receive one or more sound instances/audio signals based on a preliminary beamform tracking configuration 412, detecting the one or more sound instances within the defined space via the microphone array 414, and transmitting 416 the sound instances to the controller. The method also includes identifying the beamform tracking configuration 418 and modifying the preliminary beamform tracking configuration, based on a location of the one or more sound instances, to create a modified beamform tracking configuration 422, and saving the modified beamform tracking configuration in a memory of a microphone array controller 424. The method may also include forwarding the new microphone array beamform tracking configuration 426 and modifying the microphone array 428 accordingly based on the new configuration.

The method may further include designating a plurality of sub-regions which collectively provide the defined space, scanning each of the plurality of sub-regions for the one or more sound instances, and designating each of the plurality of sub-regions as a desired sound sub-region or an unwanted noise sub-region based on the sound instances received by the plurality of microphone arrays during the scanning of the plurality of sub-regions, and one or more sound instances may include a human voice. The method may also provide subsequently re-scanning each of the plurality of sub-regions for new desired sound instances, creating a new modified beamform tracking configuration based on new locations of the new desired sound instances, and saving the new modified beamform tracking configuration in the memory of the microphone array controller. The preliminary beamform tracking configuration for each sub-region and the modified beamform tracking configuration includes a beamform center steering location and a beamforming steering region range. Also, the method may perform determining estimated locations of the detected one or more sound instances, as detected by the microphone array, by performing microphone array localization based on time delay of arrival (TDOA) or steered response power (SRP). In addition to sound being transmitted, received and processed by the controller, determining a location via the controller may be based on the audio sensing devices may produce metadata signals which include location and/or direction vector data (i.e., error-bound direction data, spectral data and/or temporal audio data). The controller may be distributed, such as multiple controller locations which receive sound, metadata and other indicators for accurate prediction purposes.

Figure 4B:
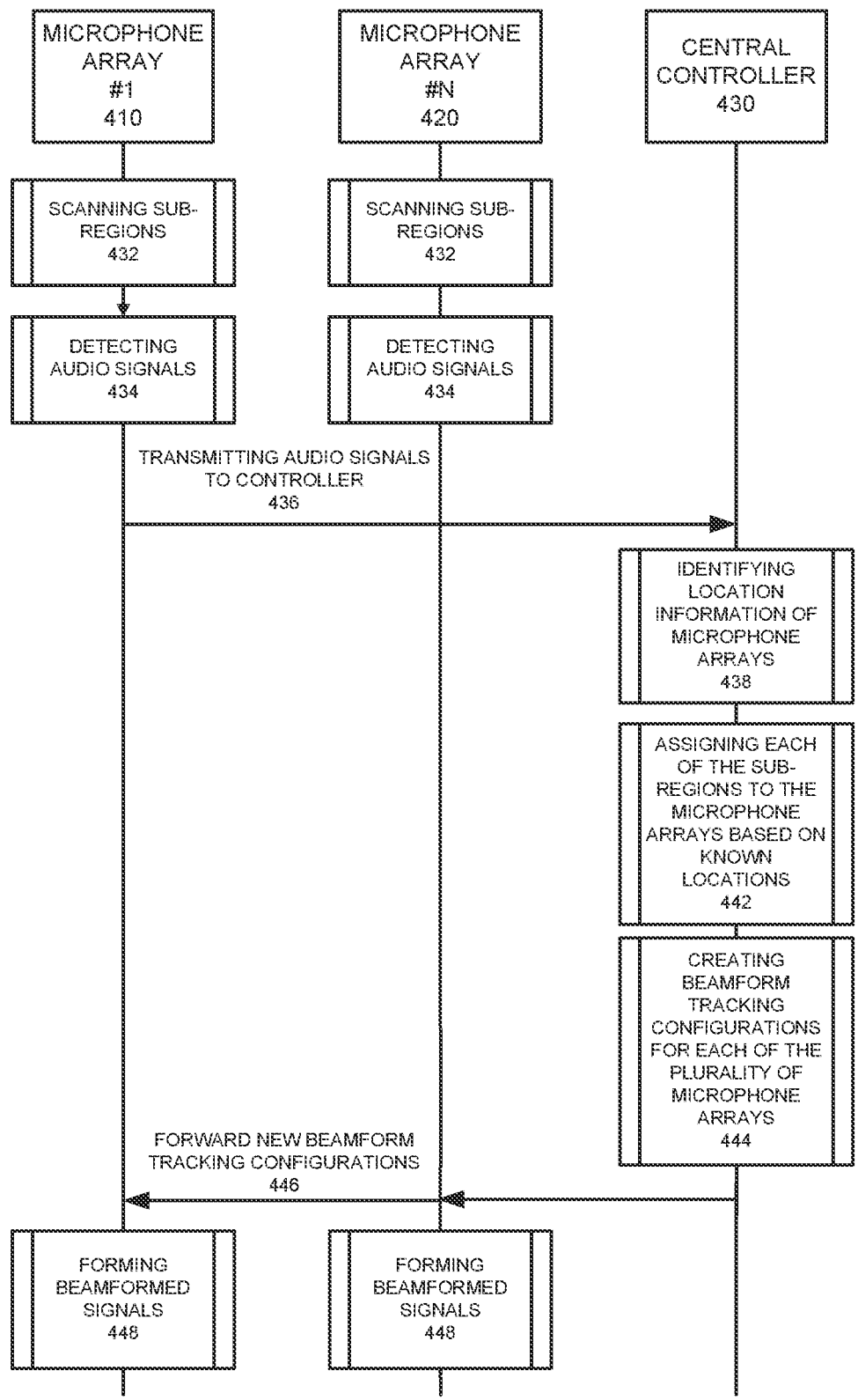
FIG. 4B illustrates a system signaling diagram of a modular microphone array system with a single reception space according to example embodiments.

FIG. 4B illustrates a system signaling diagram of a modular microphone array system with a single reception space according to example embodiments. The method 400B may include multiple microphone arrays 410/420. The method may provide scanning certain sub-regions of a room or space 432, designating a plurality of sub-regions which collectively provide a defined space, detecting the one or more audio signals 434 within the defined space via the plurality of microphone arrays to create sound impression data for the defined space at a particular time, and transmitting the audio signals to the controller 436. The method may also include configuring the central controller with known locations of each of the plurality of microphone arrays 438, assigning each of the plurality of sub-regions to at least one of the plurality of microphone arrays based on the known locations 442 and creating beamform tracking configurations for each of the plurality of microphone arrays based on their assigned sub-regions 444. Then, forwarding the new beamform tracking configurations 446 to configure the arrays and forming the beamformed signals 448.

The method may also include forming one or more beamformed signals according to the beamform tracking configurations for each of the plurality of microphone arrays, combining, via the central controller, the one or more beamformed signals from each of the plurality of microphone arrays, emitting the audio signals as an audio calibration signal from a known position, and receiving the audio calibration signal at each of the microphone arrays. The audio calibration signal may include one or more of a pulsed tone, a pseudorandom sequence signal, a chirp signal and a sweep signal, and creating the beamform tracking configurations for each of the plurality of microphone arrays further includes combining beamformed signals from each of the plurality of the microphone arrays into a single joint beamformed signal. The audio calibration signals are emitted from each of the microphone arrays and the method also include displaying beam zone and microphone array locations on a user interface.

Figure 4C:
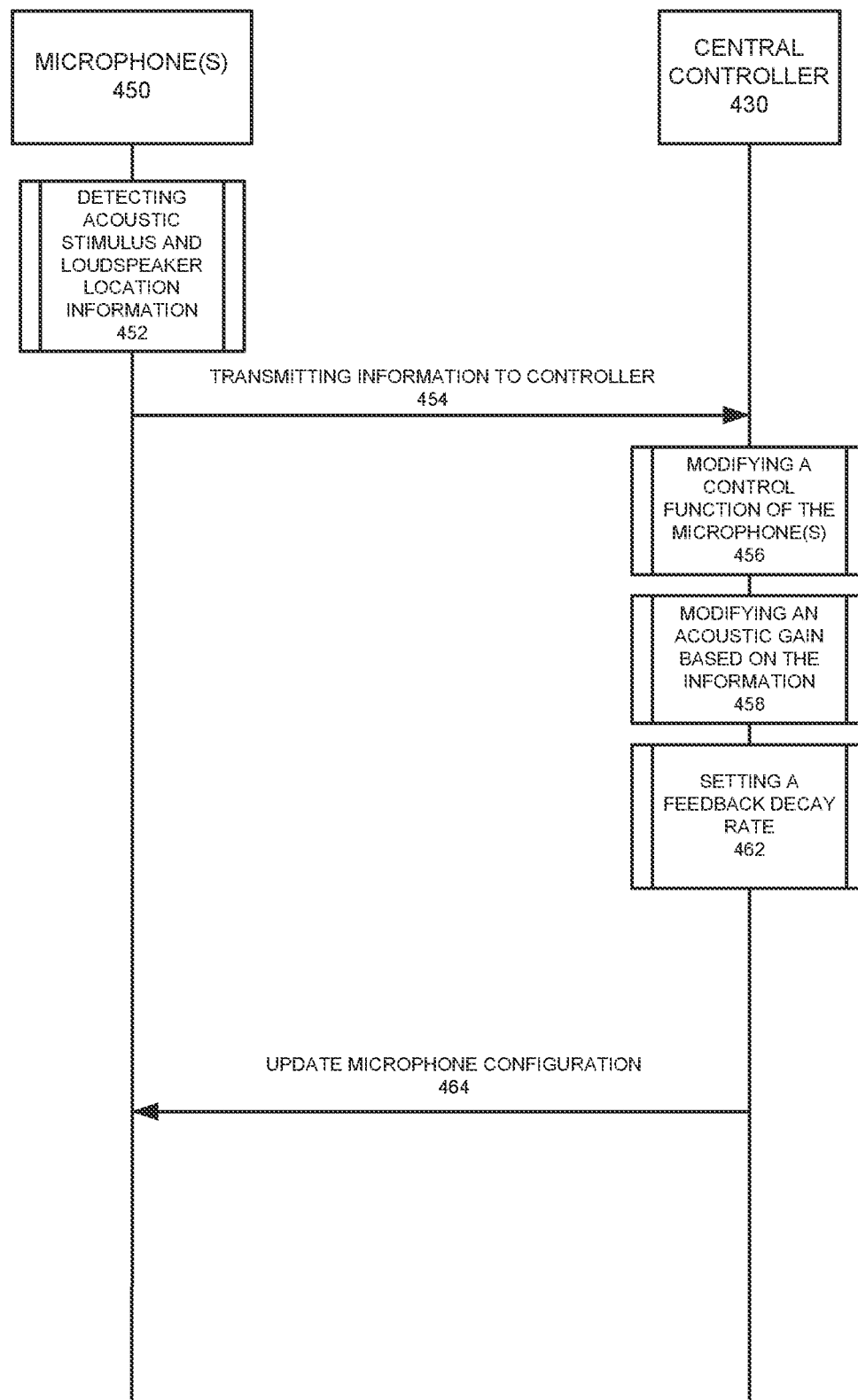
FIG. 4C illustrates a system signaling diagram of a microphone array system with mixing sound and performing gain optimization according to example embodiments.

FIG. 4C illustrates a system signaling diagram of a microphone array system with mixing sound and performing gain optimization according to example embodiments. Referring to FIG. 4C, the system may include a microphone(s) 450 communicating with a central controller 430. The method may include detecting an acoustic stimulus via active beams and/or directivity patterns associated with at least one microphone disposed in a defined space 452, and transmitting 454 the information to the controller. The method may include detecting loudspeaker location information of at least one loudspeaker providing the acoustic stimulus, transmitting acoustic stimulus information based on the acoustic stimulus to a central controller, and modifying, via a central controller, at least one control function associated with the at least one microphone and the at least one loudspeaker to minimize acoustic feedback produced by the loudspeaker 456. The method may also include modifying an acoustic gain 458 and setting a feedback decay rate 462 and updating 464 the microphone accordingly. The at least one control function includes at least one of output frequencies of the at least one loudspeaker, loudspeaker power levels of the at least one loudspeaker, input frequencies of the at least one microphone, power levels of the at least one microphone, and a delay associated with the at least one microphone and the at least one loudspeaker, to reduce the acoustic feedback produced by the at least one loudspeaker.

The method may also include increasing an acoustic gain or decreasing an acoustic gain responsive to receiving the acoustic stimulus and the loudspeaker location information. The acoustic gain includes a function of a difference between a level of the acoustic stimulus processed as output by a digital signal processor and the level of the acoustic stimulus received at the at least one microphone. The method also includes outputting the acoustic stimulus, at a known signal level, from each of a plurality of loudspeakers one loudspeaker zone at a time, and each loudspeaker zone includes one or more of the at least one loudspeaker, and the method also includes determining a delay for each combination of the at least one microphone and the plurality of loudspeakers. The method may also include performing an acoustic gain measurement for each combination of the at least one microphone and the plurality of loudspeakers, and determining whether the acoustic gain is less than a predefined threshold value, and when the acoustic gain is less than the predefined threshold value, setting a feedback decay rate based on the acoustic gain to minimize the acoustic feedback.

Figure 4D:
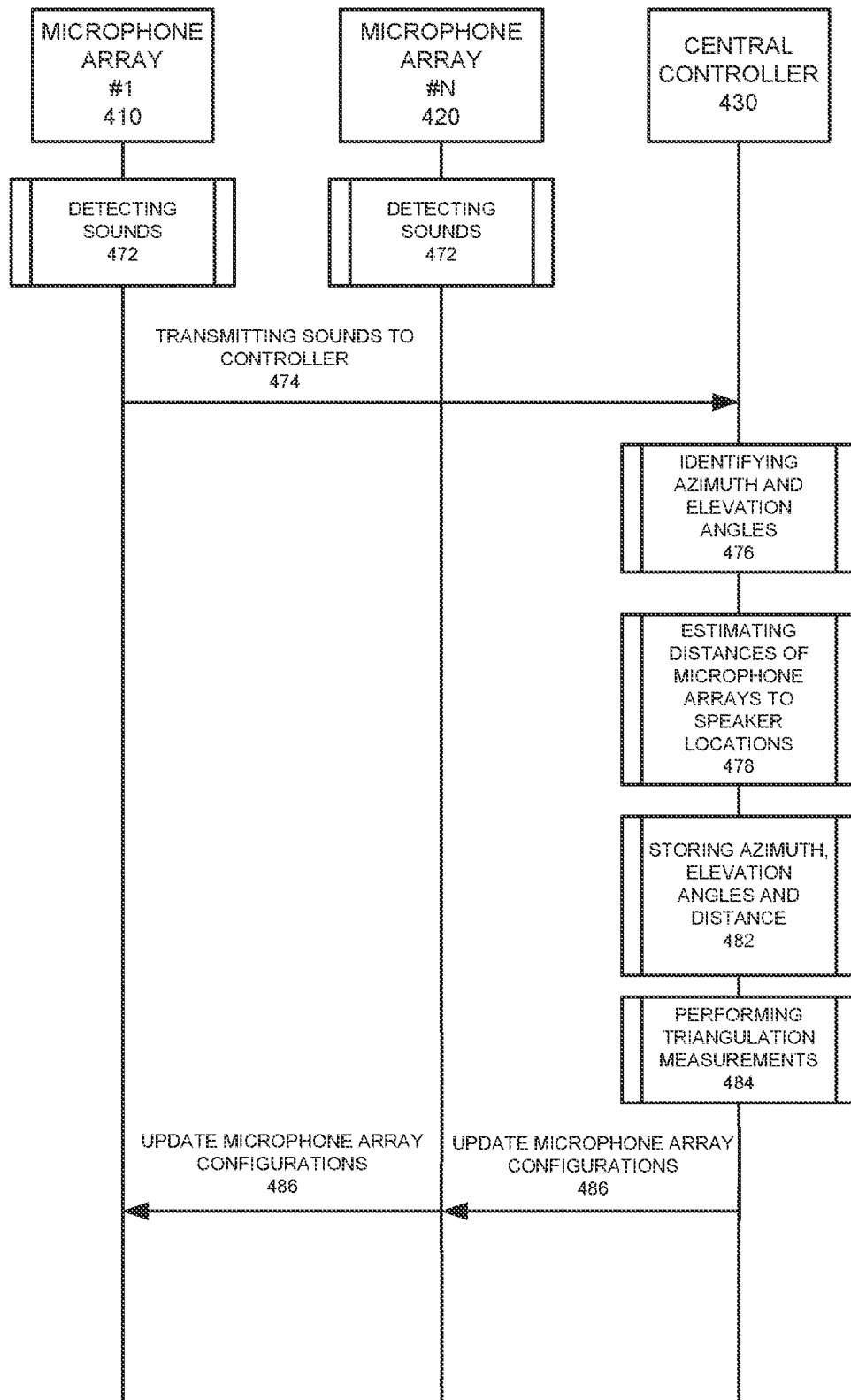
FIG. 4D illustrates a system signaling diagram of a voice tracking procedure according to example embodiments.

FIG. 4D illustrates a system signaling diagram of a voice tracking procedure according to example embodiments. Referring to FIG. 4D, the method 400D may provide initializing a plurality of microphone arrays in a defined space to receive one or more sound instances based on a preliminary beamform tracking configuration, detecting the one or more sound instances 472 within the defined space via at least one of the plurality of microphone arrays, transmitting the sounds 474 to the controller 430, identifying an azimuth angle and an elevation angle to a sound location origin of the one or more sound instances 476 as determined from one or more of the plurality of microphone arrays, estimating a distance from at least one of the microphone arrays to the sound location origin based on the azimuth angle and the elevation angle 478, and storing the azimuth angle, elevation angle and distance in a memory of a controller configured to control the plurality of microphone arrays 482. The method may also include modifying a steering direction of the at least one microphone array based on the estimated distance. The azimuth angle and the elevation angle include the steering direction. The method may also include determining time difference of arrivals of the one or more sound instances as received by at least two of the plurality of microphone arrays, and performing a triangulation calculation to identify the distance based on the time difference of arrivals 484 and updating the microphone arrays with new configurations 486. The method may also include transmitting the distance to the controller, and determining a new steering direction for the at least one of the plurality of microphone arrays based on the distance. The information may be stored in a memory of the controller. The method may also include determining a location of the plurality of microphone arrays within the defined space.

The above embodiments may be implemented in hardware, in a computer program executed by a processor, in firmware, or in a combination of the above. A computer program may be embodied on a computer readable medium, such as a storage medium. For example, a computer program may reside in random access memory ("RAM"), flash memory, read-only memory ("ROM"), erasable programmable read-only memory ("EPROM"), electrically erasable programmable read-only memory ("EEPROM"), registers, hard disk, a removable disk, a compact disk read-only memory ("CD-ROM"), or any other form of storage medium known in the art.

An exemplary storage medium may be coupled to the processor such that the processor may read information from, and write information to, the storage medium. In the alternative, the storage medium may be integral to the processor. The processor and the storage medium may reside in an application specific integrated circuit ("ASIC"). In the alternative, the processor and the storage medium may reside as discrete components. For example, FIG. 5 illustrates an example computer system architecture 500, which may represent or be integrated in any of the above-described components, etc.

Figure 5:
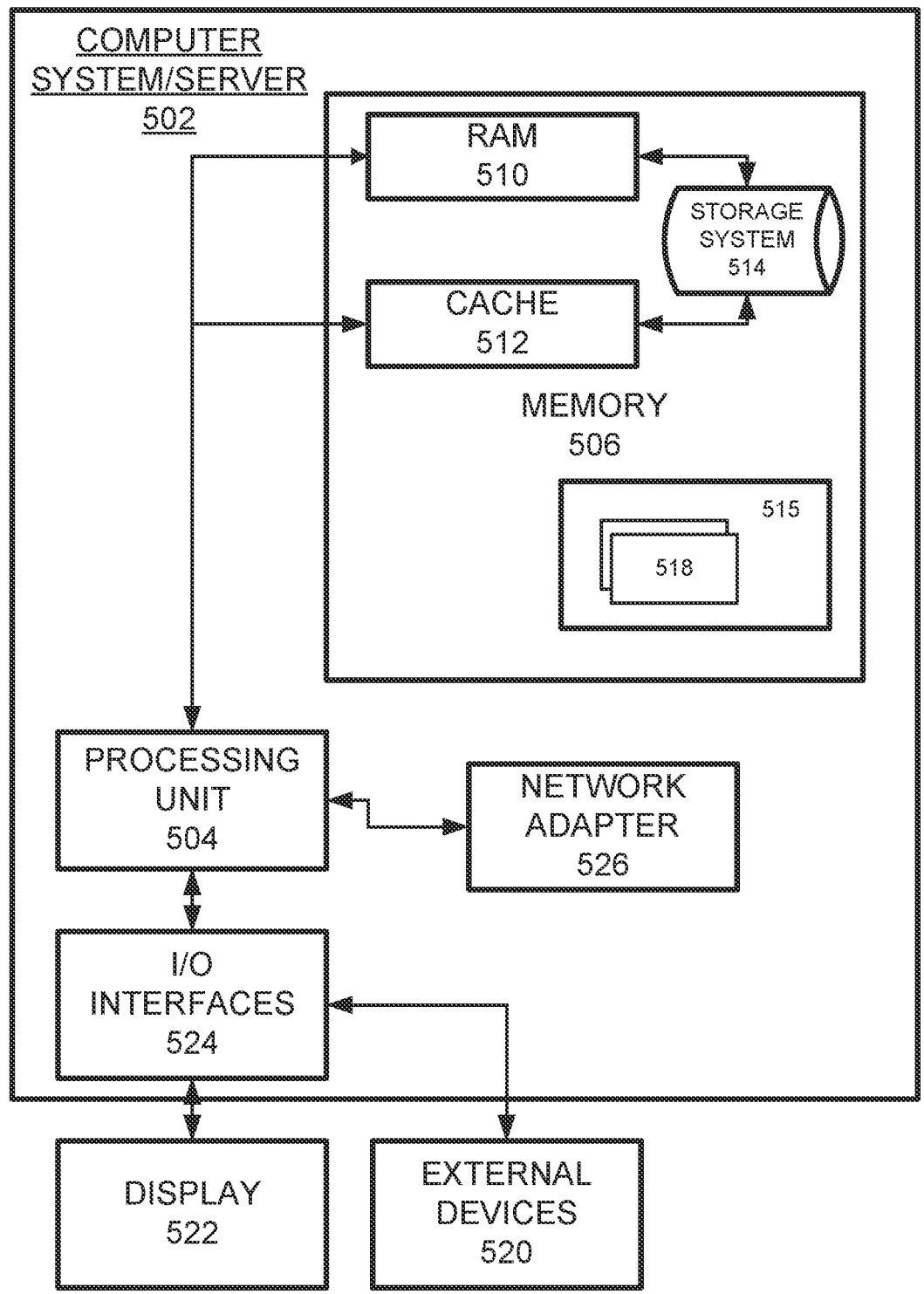
FIG. 5 illustrates an example computer system/server configured to support one or more of the example embodiments.

FIG. 5 is not intended to suggest any limitation as to the scope of use or functionality of embodiments of the application described herein. Regardless, the computing node 500 is capable of being implemented and/or performing any of the functionality set forth hereinabove.

In computing node 500 there is a computer system/server 502, which is operational with numerous other general purpose or special purpose computing system environments or configurations. Examples of well-known computing systems, environments, and/or configurations that may be suitable for use with computer system/server 502 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 502 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 502 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 5, computer system/server 502 in a computing node 500 is shown in the form of a general-purpose computing device. The components of computer system/server 502 may include, but are not limited to, one or more processors or processing units 504, a system memory 506, and a bus that couples various system components including system memory 506 to processor 504.

The bus represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 502 typically includes a variety of computer system readable media. Such media may be any available media that is accessible by computer system/server 502, and it includes both volatile and non-volatile media, removable and non-removable media. System memory 506, in one embodiment, implements the flow diagrams of the other figures. The system memory 506 can include computer system readable media in the form of volatile memory, such as random access memory (RAM) 510 and/or cache memory 512. Computer system/server 502 may further include other removable/non-removable, volatile/non-volatile computer system storage media. By way of example only, storage system 514 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus by one or more data media interfaces. As will be further depicted and described below, memory 506 may include at least one program product having a set (e.g., at least one) of program modules that are configured to carry out the functions of various embodiments of the application.

Program/utility 516, having a set (at least one) of program modules 518, may be stored in memory 506 by way of example, and not limitation, as well as an operating system, one or more application programs, other program modules, and program data. Each of the operating system, one or more application programs, other program modules, and program data or some combination thereof, may include an implementation of a networking environment. Program modules 518 generally carry out the functions and/or methodologies of various embodiments of the application as described herein.

As will be appreciated by one skilled in the art, aspects of the present application may be embodied as a system, method, or computer program product. Accordingly, aspects of the present application may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present application may take the form of a computer program product embodied in one or more computer readable medium(s) having computer readable program code embodied thereon.

Computer system/server 502 may also communicate with one or more external devices 520 such as a keyboard, a pointing device, a display 522, etc.; one or more devices that enable a user to interact with computer system/server 502; and/or any devices (e.g., network card, modem, etc.) that enable computer system/server 502 to communicate with one or more other computing devices. Such communication can occur via I/O interfaces 524. Still yet, computer system/server 502 can communicate with one or more networks such as a local area network (LAN), a general wide area network (WAN), and/or a public network (e.g., the Internet) via network adapter 526. Also, communications with an external audio device, such as a microphone array over the network or via another proprietary protocol may also be necessary to transfer/share audio data. As depicted, network adapter 526 communicates with the other components of computer system/server 502 via a bus. It should be understood that although not shown, other hardware and/or software components could be used in conjunction with computer system/server 502. Examples, include, but are not limited to: microcode, device drivers, redundant processing units, external disk drive arrays, RAID systems, tape drives, and data archival storage systems, etc.

Although an exemplary embodiment of at least one of a system, method, and non-transitory computer readable medium has been illustrated in the accompanied drawings and described in the foregoing detailed description, it will be understood that the application is not limited to the embodiments disclosed, but is capable of numerous rearrangements, modifications, and substitutions as set forth and defined by the following claims. For example, the capabilities of the system of the various figures can be performed by one or more of the modules or components described herein or in a distributed architecture and may include a transmitter, receiver or pair of both. For example, all or part of the functionality performed by the individual modules, may be performed by one or more of these modules. Further, the functionality described herein may be performed at various times and in relation to various events, internal or external to the modules or components. Also, the information sent between various modules can be sent between the modules via at least one of: a data network, the Internet, a voice network, an Internet Protocol network, a wireless device, a wired device and/or via plurality of protocols. Also, the messages sent or received by any of the modules may be sent or received directly and/or via one or more of the other modules.

One skilled in the art will appreciate that a "system" could be embodied as a personal computer, a server, a console, a personal digital assistant (PDA), a cell phone, a tablet computing device, a smartphone or any other suitable computing device, or combination of devices. Presenting the above-described functions as being performed by a "system" is not intended to limit the scope of the present application in any way, but is intended to provide one example of many embodiments. Indeed, methods, systems and apparatuses disclosed herein may be implemented in localized and distributed forms consistent with computing technology.

It should be noted that some of the system features described in this specification have been presented as modules, in order to more particularly emphasize their implementation independence. For example, a module may be implemented as a hardware circuit comprising custom very large scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices, graphics processing units, or the like.

A module may also be at least partially implemented in software for execution by various types of processors. An identified unit of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module. Further, modules may be stored on a computer-readable medium, which may be, for instance, a hard disk drive, flash device, random access memory (RAM), tape, or any other such medium used to store data.

Indeed, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

It will be readily understood that the components of the application, as generally described and illustrated in the figures herein, may be arranged and designed in a wide variety of different configurations. Thus, the detailed description of the embodiments is not intended to limit the scope of the application as claimed, but is merely representative of selected embodiments of the application.

One having ordinary skill in the art will readily understand that the above may be practiced with steps in a different order, and/or with hardware elements in configurations that are different than those which are disclosed. Therefore, although the application has been described based upon these preferred embodiments, it would be apparent to those of skill in the art that certain modifications, variations, and alternative constructions would be apparent.

While preferred embodiments of the present application have been described, it is to be understood that the embodiments described are illustrative only and the scope of the application is to be defined solely by the appended claims when considered with a full range of equivalents and modifications (e.g., protocols, hardware devices, software platforms etc.) thereto.

What is claimed is:

1. A method, comprising:
   minimizing acoustic feedback produced by at least one loudspeaker of a plurality of loudspeakers, by modifying, based on an acoustic stimulus, at least one control function associated with at least one microphone and the at least one loudspeaker;
   outputting, from each loudspeaker of the plurality of loudspeakers, the acoustic stimulus; and determining a delay for each combination of the at least one microphone and the each loudspeaker of the plurality of loudspeakers;

wherein when a measurement of an acoustic gain is less than a predefined threshold value, a feedback decay rate is set based on the acoustic gain to minimize the acoustic feedback.

2. The method of claim 1, wherein the at least one control function comprises at least one of:
output frequencies of the at least one loudspeaker,
loudspeaker power levels of the at least one loudspeaker,
input frequencies of the at least one microphone,
power levels of the at least one microphone, and
a delay associated with the at least one microphone and the at least one loudspeaker, to reduce the acoustic feedback produced by the at least one loudspeaker.

3. The method of claim 1, further comprising:
increasing the acoustic gain or decreasing the acoustic gain responsive to receiving the acoustic stimulus and loudspeaker characteristic information of the at least one loudspeaker.

4. The method of claim 3, wherein the acoustic gain comprises a function of a difference between a level of the acoustic stimulus processed as output by a digital signal processor and the level of the acoustic stimulus received at the at least one microphone.

5. The method of claim 1, further comprising:
detecting the acoustic stimulus via active beams associated with the at least one microphone disposed in a defined space.

6. The method of claim 1, further comprising:
performing the measurement for each combination of the at least one microphone and the plurality of loudspeakers.

7. The method of claim 1, wherein the acoustic stimulus is output at a known signal level one loudspeaker zone at a time, wherein each loudspeaker zone comprises one or more of the at least one loudspeaker.

8. The method of claim 1, wherein the at least one microphone comprises one or more microphone arrays configured to detect loudspeaker characteristic information of the at least one loudspeaker.

9. An apparatus, comprising:
a processor configured to:
minimize acoustic feedback produced by at least one loudspeaker of a plurality of loudspeakers, by a modification based on an acoustic stimulus, at least one control function associated with at least one microphone and the at least one loudspeaker;
output, from each loudspeaker of the plurality of loudspeakers, the acoustic stimulus; and
determine a delay for each combination of the at least one microphone and the each loudspeaker of the plurality of loudspeakers;
wherein when a measurement of an acoustic gain is less than a predefined threshold value, a feedback decay rate is set based on the acoustic gain to minimize the acoustic feedback.

10. The apparatus of claim 9, wherein the at least one control function comprises at least one of:
output frequencies of the at least one loudspeaker,
loudspeaker power levels of the at least one loudspeaker,
input frequencies of the at least one microphone,
power levels of the at least one microphone, and
a delay associated with the at least one microphone and the at least one loudspeaker, to reduce the acoustic feedback produced by the at least one loudspeaker.

11. The apparatus of claim 9, wherein the processor is further configured to:
increase the acoustic gain or decreasing the an acoustic gain responsive to receiving the acoustic stimulus and loudspeaker characteristic information of the at least one loudspeaker.

12. The apparatus of claim 11, wherein the acoustic gain comprises a function of a difference between a level of the acoustic stimulus processed as output by a digital signal processor and the level of the acoustic stimulus received at the at least one microphone.

13. The apparatus of claim 9, wherein the processor is further configured to:
detect the acoustic stimulus via active beams associated with the at least one microphone disposed in a defined space.

14. The apparatus of claim 9, wherein the processor is further configured to:
perform the measurement for each combination of the at least one microphone and the plurality of loudspeakers.

15. The apparatus of claim 9,
wherein the at least one microphone comprises one or more microphone arrays configured to detect loudspeaker characteristic information of the at least one loudspeaker.

16. A non-transitory computer readable storage medium configured to store at least one instruction that when executed by a processor causes the processor to perform:
minimizing acoustic feedback produced by at least one loudspeaker of a plurality of loudspeakers, by modifying based on an acoustic stimulus, at least one control function associated with at least one microphone and at the least one loudspeaker;
outputting, from each loudspeaker of the plurality of loudspeakers, the acoustic stimulus; and
determining a delay for each combination of the at least one microphone and the each loudspeaker of the plurality of loudspeakers;
wherein when a measurement of the acoustic gain is less than a predefined threshold value, a feedback decay rate is set based on the acoustic gain to minimize the acoustic feedback.

17. The non-transitory computer readable storage medium of claim 16, wherein the at least one control function comprises:
at least one of output frequencies of the at least one loudspeaker,
loudspeaker power levels of the at least one loudspeaker,
input frequencies of the at least one microphone,
power levels of the at least one microphone, and
a delay associated with the at least one microphone and the at least one loudspeaker, to reduce the acoustic feedback produced by the at least one loudspeaker.

18. The non-transitory computer readable storage medium of claim 16, further configured to store at least one instruction that when executed by the processor causes the processor to perform:
increasing the acoustic gain or decreasing the acoustic gain responsive to receiving the acoustic stimulus and loudspeaker characteristic information of the at least one loudspeaker.

19. The non-transitory computer readable storage medium of claim 18, wherein the acoustic gain comprises a function of a difference between a level of the acoustic stimulus processed as output by a digital signal processor and the level of the acoustic stimulus received at the at least one microphone.

20. The non-transitory computer readable storage medium of claim 16, further configured to store at least one instruction that when executed by the processor causes the processor to perform:

performing the measurement for each combination of the at least one microphone and the plurality of loudspeakers.

\* \* \* \* \*